US006980194B2

(12) United States Patent
Tobita

(10) Patent No.: US 6,980,194 B2
(45) Date of Patent: Dec. 27, 2005

(54) AMPLITUDE CONVERSION CIRCUIT FOR CONVERTING SIGNAL AMPLITUDE

(75) Inventor: Youichi Tobita, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 323 days.

(21) Appl. No.: 10/376,241

(22) Filed: Mar. 3, 2003

(65) Prior Publication Data

US 2003/0169225 A1      Sep. 11, 2003

Related U.S. Application Data

(63) Continuation-in-part of application No. 10/253,812, filed on Sep. 25, 2002, now abandoned.

(30) Foreign Application Priority Data

Mar. 11, 2002   (JP) ............... 2002-065311
Nov. 28, 2002   (JP) ............... 2002-345939

(51) Int. Cl.[7] ............. G09G 3/36; H03K 19/0175; H03L 5/00
(52) U.S. Cl. ............. 345/100; 326/63; 327/333
(58) Field of Search . 345/100; 349/41–52; 326/62–92; 327/333

(56) References Cited

U.S. PATENT DOCUMENTS 5,541,546 A * 7/1996 Okumura .................. 327/333
5,821,799 A * 10/1998 Saripella ................... 327/333
5,933,043 A * 8/1999 Utsunomiya et al. ....... 327/333
6,087,880 A * 7/2000 Takagi ...................... 327/333
6,163,179 A * 12/2000 Huang et al. .............. 327/108
6,255,888 B1 * 7/2001 Satomi ...................... 327/333
6,407,579 B1 * 6/2002 Goswick .................... 326/81
6,801,181 B2 * 10/2004 Matsumoto et al. ........ 345/98
2001/0011917 A1 * 8/2001 Kim et al. ................. 327/333
2002/0105370 A1 * 8/2002 Ho .......................... 327/333
2002/0140455 A1 * 10/2002 Yamaguchi ................ 326/81
2002/0180508 A1 * 12/2002 Kanno et al. .............. 327/333
2003/0146781 A1 * 8/2003 Chang et al. .............. 327/333

FOREIGN PATENT DOCUMENTS

| JP | 49-73644 | 7/1974 |
| JP | 50-151433 | 12/1975 |
| JP | 6-216753 | 8/1994 |
| JP | 11-145821 | 5/1999 |
| JP | 11-177409 | 7/1999 |

* cited by examiner

Primary Examiner—Xiao Wu
Assistant Examiner—M. Fatahiyar
(74) Attorney, Agent, or Firm—McDermott Will & Emery LLP

(57) ABSTRACT

A level shifter includes first and second P-type TFTs for latching a level of first and second output nodes, first and second N-type TFTs for setting the level of the first and second output nodes, and a drive circuit. The drive circuit includes third to eighth N-type TFTs providing, in response to rising and falling edges of an input signal, a voltage higher than a threshold voltage of the first and second N-type TFTs, between the gate and source of the first and second N-type TFTs, and includes first and second capacitors and a resistor element. Accordingly, even if an amplitude voltage of an input signal is smaller than the threshold voltage of the first and second N-type TFTs, the level shifter operates normally.

19 Claims, 27 Drawing Sheets

AMPLITUDE CONVERSION CIRCUIT FOR CONVERTING SIGNAL AMPLITUDE

RELATED APPLICATIONS

The application is a Continuation-In-Part of U.S. patent application Ser. No. 10/253,812, filed Sep. 25, 2002 now abandoned, which is incorporated herein by reference.

BACKGROUND OF THE INVENTION

1. Field of the Invention

The present invention relates to amplitude conversion circuits. In particular, the present invention relates to an amplitude conversion circuit for changing an amplitude of a signal.

2. Description of the Background Art

FIG. 27 is a block diagram showing a configuration of a part of a conventional cellular phone that is involved in image display.

Referring to FIG. 27, the cellular phone includes a control LSI 71 which is a MOST (MOS transistor) integrated circuit, a level shifter 72 which is also a MOST integrated circuit, and a liquid crystal display 73 which is a TFT (thin-film transistor) integrated circuit.

Control LSI 71 generates a control signal for liquid crystal display 73. The control signal has an H or logical high level of 3 V and an L or logical low level of 0 V. Although a large number of control signals are actually generated, it is herein assumed, for convenience of description, that one control signal is generated. Level shifter 72 converts the logic level of the control signal supplied from control LSI 71 to generate an internal control signal. The internal control signal has an H level of 7.5 V and an L level of 0 V. Liquid crystal display 73 presents an image according to the internal control signal from level shifter 72.

FIG. 28 is a circuit diagram showing a configuration of level shifter 72. Referring to FIG. 28, level shifter 72 includes P-channel MOS transistors 74 and 75 and N-channel MOS transistors 76 and 77. P-channel MOS transistors 74 and 75 are connected between a node N71 of a power supply potential VCC (7.5 V) and output nodes N74 and N75 respectively, and have respective gates connected to output nodes N75 and N74 respectively. N-channel MOS transistors 76 and 77 are connected respectively between output nodes N74 and N75 and a node of a ground potential GND, and have respective gates receiving input signals VI and /VI.

Here, it is supposed that input signals VI and /VI respectively have L level (0 V) and H level (3 V) while output signals VO and /VO respectively have H level (7.5 V) and L level (0 V). Then, MOS transistors 74 and 77 are turned on while MOS transistors 75 and 76 are turned off.

In this state, input signal VI is raised from L level (0 V) to H level (3 V) and input signal /VI is lowered from H level (3 V) to L level (0 V). Then, N-channel MOS transistor 76 is turned on first to cause the potential on output node N74 to decrease. When the potential on output node N74 decreases below the potential determined by subtracting the absolute value of a threshold voltage of P-channel MOS transistor 75 from power supply potential VCC, P-channel MOS transistor 75 is turned on to start increase of the potential on output node N75. The increasing potential on output node N75 decreases the source-gate voltage of P-channel MOS transistor 74 and accordingly increases the ON resistance value of P-channel MOS transistor 74, and the potential on output node N74 further decreases. The circuit thus operates in positive feedback manner so that output signals VO and /VO have L level (0 V) and H level (7.5 V) respectively and the level converting operation is completed.

A level shifter disclosed for example in Japanese Patent Laying-Open No. 11-145821 has P-channel MOS transistors 74 and 75 with respective gates both connected to one output node N74 or N75.

As discussed above, the conventional level shifter 72 operates on the precondition that N-channel MOS transistor 76 is turned on in response to rising of input signal VI from L level (0 V) to H level (3 V). In order to render N-channel MOS transistor 76 conductive, the threshold voltage of N-channel MOS transistor 76 must be H level (3 V) or less of input signal VI.

The threshold voltage of a commonly used semiconductor LSI is easily set at 3V or less. However, there is a considerable difference in the threshold voltage between low-temperature polysilicon TFTs included in the liquid crystal display, which makes it difficult to set the threshold voltage of the TFTs at 3 V or less. Then, as shown in FIG. 27, level shifter 72 constituted of high-withstand-voltage MOS transistors is provided between control LSI 71 and liquid crystal display 73 to change the logic level of the signal.

However, the cost of level shifter 72 thus provided adds to the system cost, resulting in increase of the system cost.

SUMMARY OF THE INVENTION

One object of the present invention is to provide an amplitude conversion circuit and a semiconductor device using the amplitude conversion circuit which normally operates even if a voltage amplitude of an input signal is smaller than the threshold voltage of an input transistor.

An amplitude conversion circuit according to the present invention converts a first signal with an amplitude corresponding to a first voltage into a second signal with an amplitude corresponding to a second voltage higher than the first voltage, and includes first and second transistors of a first conductivity type, third and fourth transistors of a second conductivity type, and a drive circuit. The first and second transistors have respective first electrodes both receiving the second voltage, respective second electrodes connected respectively to first and second output nodes for providing the second signal and a complementary signal of the second signal, and respective input electrodes connected respectively to the second and first output nodes. Respective first electrodes of the third and fourth transistors are connected respectively to the first and second output nodes. The drive circuit is driven by the first signal and a complementary signal of the first signal, provides, in response to a leading edge of the complementary signal of the first signal, a third voltage higher than the first voltage between an input electrode and a second electrode of the third transistor to turn on the third transistor, and provides, in response to a leading edge of the first signal corresponding to a trailing edge of the complementary signal of the first signal, the third voltage between an input electrode and a second electrode of the fourth transistor to turn on the fourth transistor. Thus, in response to the leading or trailing edge of the first signal, the third voltage which is higher than the threshold voltage of the third and fourth transistors is supplied between the input electrode and the second electrode of the third or fourth transistor. A normal operation is accordingly accomplished even if the amplitude of the first signal is smaller than the threshold voltage of the third and fourth transistors.

Another amplitude conversion circuit according to the present invention converts a first signal with an amplitude corresponding to a first voltage into a second signal with an amplitude corresponding to a second voltage higher than the first voltage, and includes first and second transistors of a first conductivity type, third and fourth transistors of a second conductivity type, and a drive circuit. The first and second transistors have respective first electrodes both receiving the second voltage, respective second electrodes connected respectively to first and second output nodes for providing a second signal and a complementary signal of the second signal, and respective input electrodes both connected to the second output node. Respective first electrodes of the third and fourth transistors are connected to the first and second output nodes respectively. The drive circuit is driven by the first signal and a complementary signal of the first signal, provides, in response to a leading edge of the complementary signal of the first signal, a third voltage higher than the first voltage between an input electrode and a second electrode of the third transistor to turn on the third transistor, and provides, in response to a leading edge of the first signal corresponding to a trailing edge of the complementary signal of the first signal, the third voltage between an input electrode and a second electrode of the fourth transistor to turn on the fourth transistor. In this way, in response to the leading or trailing edge of the first signal, the third voltage which is higher than the threshold voltage of the third and fourth transistors is supplied between the input electrode and the second electrode of the third or fourth transistor. A normal operation is accordingly accomplished even if the amplitude of the first signal is smaller than the threshold voltage of the third and fourth transistors.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
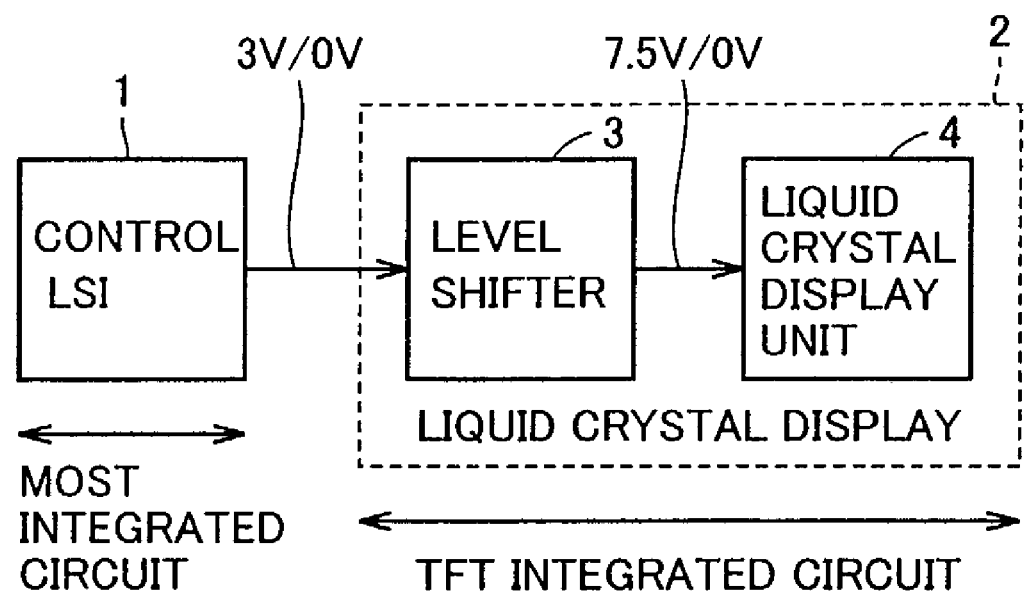
FIG. 1 is a block diagram showing a configuration of a part of a cellular phone that is involved in image display according to one embodiment of the present invention.

FIG. 1 is a block diagram showing a configuration of a part of a cellular phone that is involved in image display according to one embodiment of the present invention.

Referring to FIG. 1, the cellular phone includes a control LSI 1 which is a MOST integrated circuit and a liquid crystal display 2 which is a TFT integrated circuit. Liquid crystal display 2 includes a level shifter 3 and a liquid crystal display unit 4.

Control LSI 1 generates a control signal for liquid crystal display 2. The control signal has its H level of 3 V and its L level of 0 V. Although a large number of control signals are actually generated, it is assumed here for convenience of description that one control signal is generated. Level shifter 3 changes the logic level of the control signal from control LSI 1 to generate an internal control signal. The internal control signal has its H level of 7.5 V and its L level of 0 V. Liquid crystal display unit 4 presents an image according to the internal control signal from level shifter 3.

Figure 2:
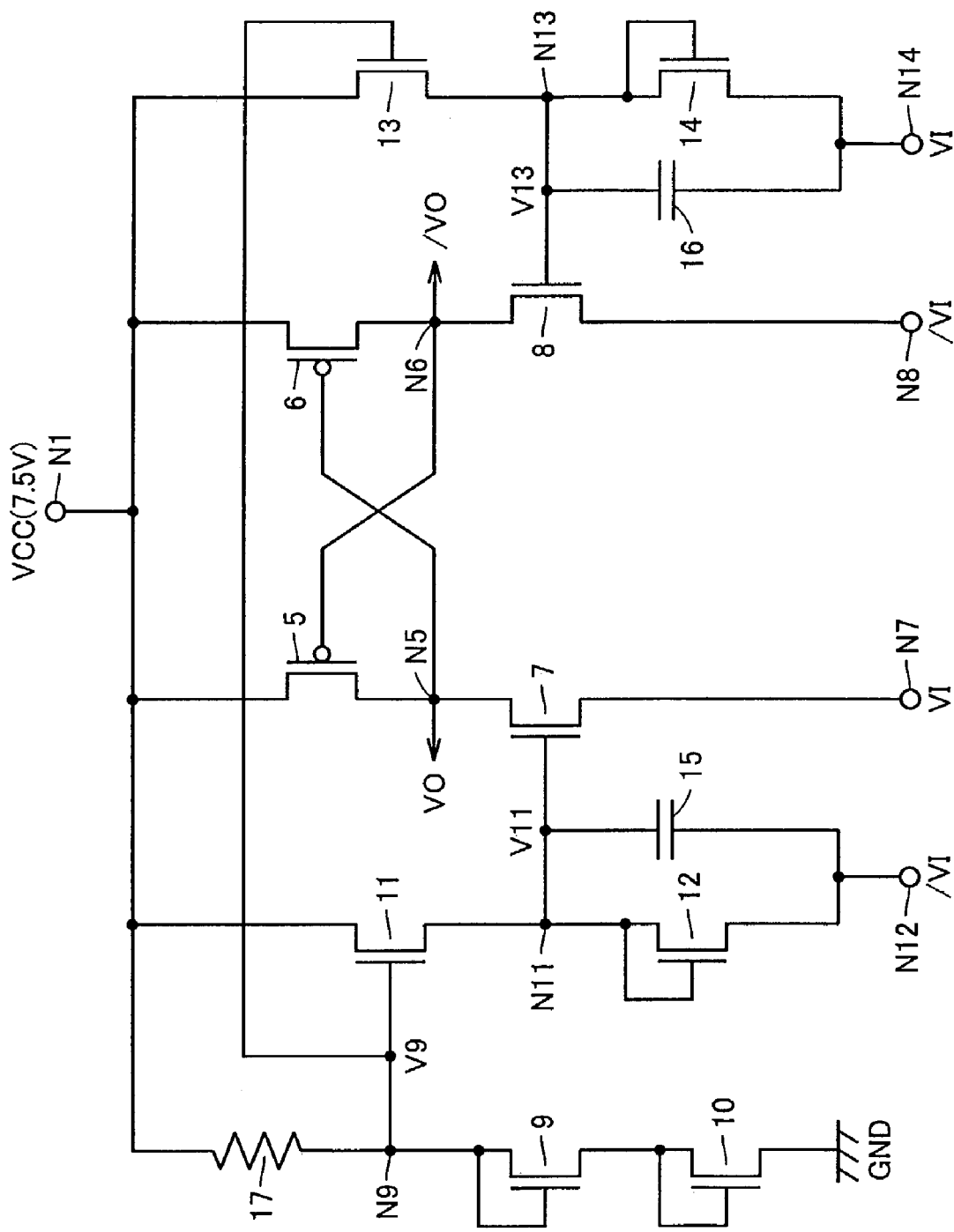
FIG. 2 is a circuit diagram showing a configuration of a level shifter shown in FIG. 1.

FIG. 2 is a circuit diagram showing a configuration of level shifter 3. Referring to FIG. 2, level shifter 3 includes P-type TFTs 5 and 6, N-type TFTs 7–14, capacitors 15 and 16, and a resistor element 17. P-type TFTs 5 and 6 are connected between a node N1 of a power supply potential VCC (7.5 V) and output nodes N5 and N6 respectively and have respective gates connected to output nodes N6 and N5. Signals on respective output nodes N5 and N6 are output signals VO and /VO of level shifter 3. N-type TFT 7 is connected between nodes N5 and N7, having its gate connected to a node N11. N-type TFT 8 is connected between nodes N6 and N8, having its gate connected to a node N13. Nodes N7 and N8 are respectively provided with an input signal VI and a complementary signal /VI thereof.

Resistor element 17 and N-type TFTs 9 and 10 are connected in series between node N1 of power supply potential VCC and a node of ground potential GND. The gate of N-type TFT 9 is connected to its drain (node N9) and the gate of N-type TFT 10 is connected to its drain. N-type TFTs 9 and 10 each constitute a diode device and, resistor element 17 and N-type TFTs 9 and 10 constitute a constant potential generating circuit. When the resistance value of resistor element 17 is made sufficiently large (e.g. 100 MΩ) while the ON resistance value of N-type TFTs 9 and 10 is made sufficiently small relative to the resistance value of resistor element 17, node N9 has its potential V9 equal to 2VTN (V9=2VTN), where VTN represents the threshold potential of the N-type TFTs.

N-type TFT 11 is connected between node N1 of power supply potential VCC and node N11 and has its gate receiving potential V9 on node N9. N-type TFT 12 is connected between nodes N11 and N12 and has its gate connected to node N11. N-type TFT 12 constitutes a diode element. Capacitor 15 is connected between nodes N11 and N12. Node N12 receives input signal /VI.

N-type TFT 13 is connected between node N1 of power supply potential VCC and node N13 and has its gate receiving potential V9 on node N9. N-type TFT 14 is connected between nodes N13 and N14 and has its gate connected to node N13. N-type TFT 14 constitutes a diode element. Capacitor 16 is connected between nodes N13 and N14. Node N14 receives input signal VI.

Level shifter 3 operates as described below. It is now supposed that input signals VI and /VI have 3 V and 0 V respectively. As N-type TFT 11 operates in source-follower manner, potential V11 on node N11 is represented by: V11=2VTN−VTN=VTN. Diode-connected N-type TFT 12 has its threshold potential of VTN and thus almost no current flows from node N1 of power supply potential VCC to node N11. N-type TFT 7 has its gate potential V11 equal to VTN and its source potential of 3V, and thus N-type TFT 7 is turned off. Capacitor 15 is charged to threshold voltage VTN.

As described below, potential V13 on node N13 is charged to VTN or higher and node N8 has 0 V, and thus N-type TFT 8 is turned on. Then, output node N6 has the potential (0 V) on input node N8, P-type TFT 5 is turned on, and output node N5 has power supply potential VCC. Accordingly, P-type TFT 6 is turned off and no current flows between node N1 of power supply potential VCC and input node N8.

It is then supposed that input signal VI is lowered from 3 V to 0 V and input signal /VI is raised from 0 V to 3 V. The change of the potential of input signal /VI is transmitted via capacitor 15 by capacitive coupling to node N11 to raise potential V11 on node N11. When capacitor 15 has a capacitance value which is sufficiently larger than a capacitance value of a parasitic capacitance (not shown) of node N11, potential V11 on output node N11 is represented by: V11≈VTN+ΔVI=VTN+3 V, where ΔVI represents the amplitude of input signals VI and /VI and is 3 V. Since the potential on the source (node N7) of N-type TFT 7 is equal to 0 V, the gate-source voltage of N-type TFT 7 is equal to VTN+3 V, and N-type TFT 7 is turned on. Consequently, the potential on node N5 has 0 V to turn on P-type TFT 6.

The potential change from 3 V to 0 V of input signal VI is transmitted via capacitor 16 by capacitive coupling to node N13 to decrease potential V13 on node N13. Suppose that input signals VI and /VI change at short intervals. As potential V13 on node N13 that has not been decreased is represented by V13=VTN+3 V, decreased potential V13 is represented by V13=VTN+3 V−3 V=VTN. Next, suppose that input signals VI and /VI change at longer intervals. Potential V13 on node N13 that is a potential raised by the capacitive coupling decreases with passage of time. Accordingly, potential V13 on node N13 is smaller than VTN which is a potential value when the input signals change at short intervals, by the decreased amount of potential. In this case, N-type TFT 13 is turned on to raise potential V13 on node N13 to VTN.

Gate potential V13 of N-type TFT 8 is thus equal to VTN and the source potential (node N8) thereof is equal to 3 V, which turns off N-type TFT 8. The potential on output node N6 is thus 7.5 V and P-type TFT 5 is turned off. Output nodes N5 and N6 are thus equal to 0 V and 7.5 V respectively. In this way, the logic level is converted from 3 V to 7.5 V.

According to this embodiment, in response to the falling edge of input signal VI, voltage VTN+3 V is supplied between the gate and source of N-type TFT 7, where VTN is the threshold voltage of N-type TFT 7 and 3 V corresponds to the amplitude voltage of input signal /VI. Thus, even if the amplitude voltage (3 V) of input signal /VI is smaller than threshold voltage VTN of N-type TFT 7, level shifter 3 normally operates. It is accordingly possible to constitute one liquid crystal display 2 (TFT integrated circuit) by level shifter 3 and liquid crystal display unit 4. The number of components is thus decreased to lower the system cost as compared with the conventional system in which level shifter 52 and liquid crystal display 53 are separately provided.

Although a power supply current transiently flows in the course of operation, the current does not directly flow through components except for resistor element 17 and N-type TFTs 9 and 10. Resistor element 17 has a large resistance value and thus only a slight current flows. Then, level shifter 3 consumes a considerably small power.

Instead of TFTs 5–14 of this embodiment, MOS transistors may be used. In this case, the level shifter operates even if the amplitude of input signals VI and /VI is smaller than the threshold voltage of a MOS transistor.

In addition, instead of the TFT which is an insulated gate field effect transistor, another type of field effect transistor may be used.

Figure 3:
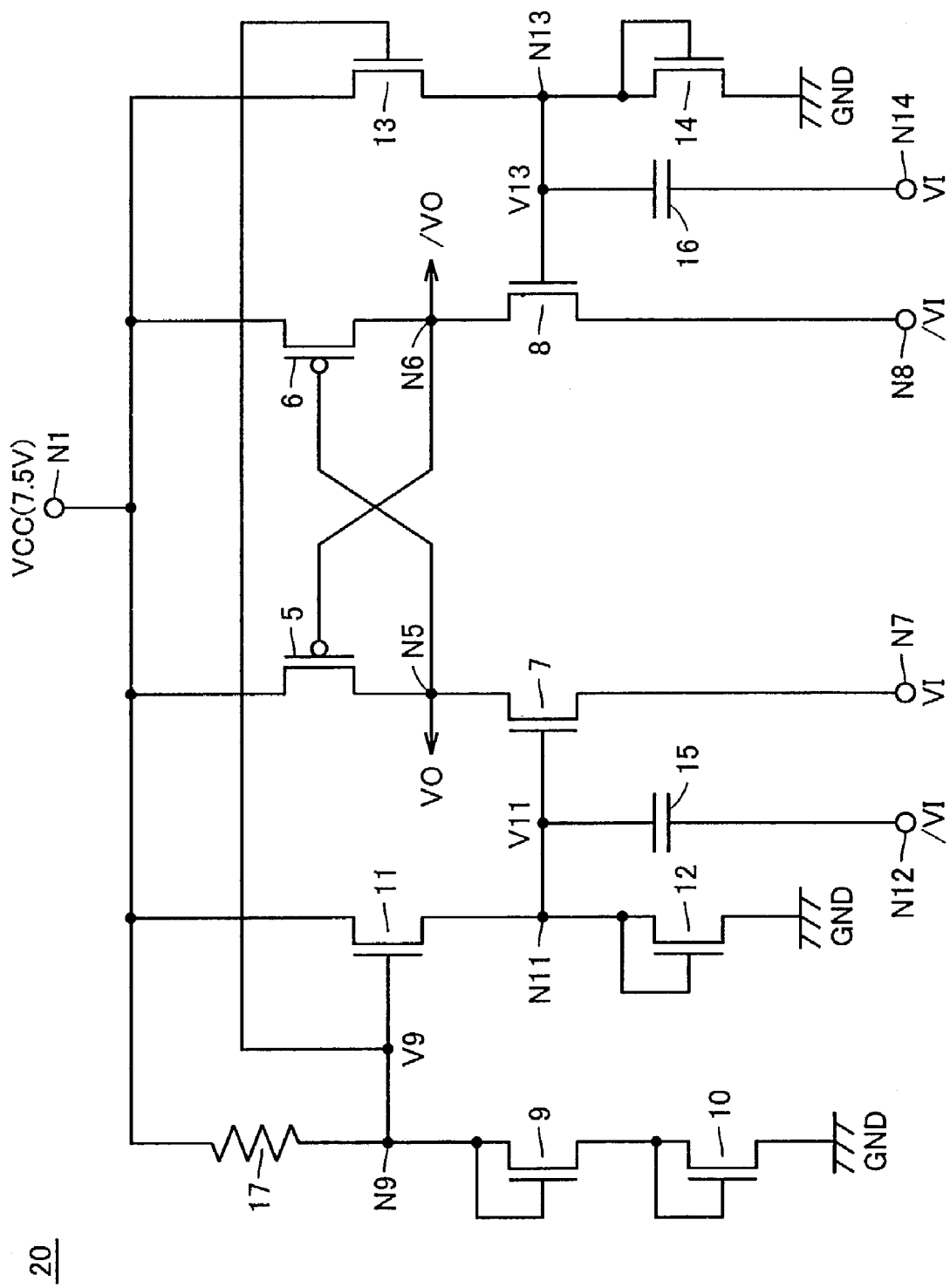
FIGS. 3 to 26 are circuit diagrams each showing a modification of the embodiment.

Various modifications of the embodiment are now described. A level shifter 20 shown in FIG. 3 includes N-type TFTs 12 and 14 with respective sources grounded. According to this modification, the current through N-type TFTs 12 and 14 is not directed to input nodes N12 and N14 but to the node of ground potential GND. Only a small drive power is required for input signals VI and /VI.

Figure 4:
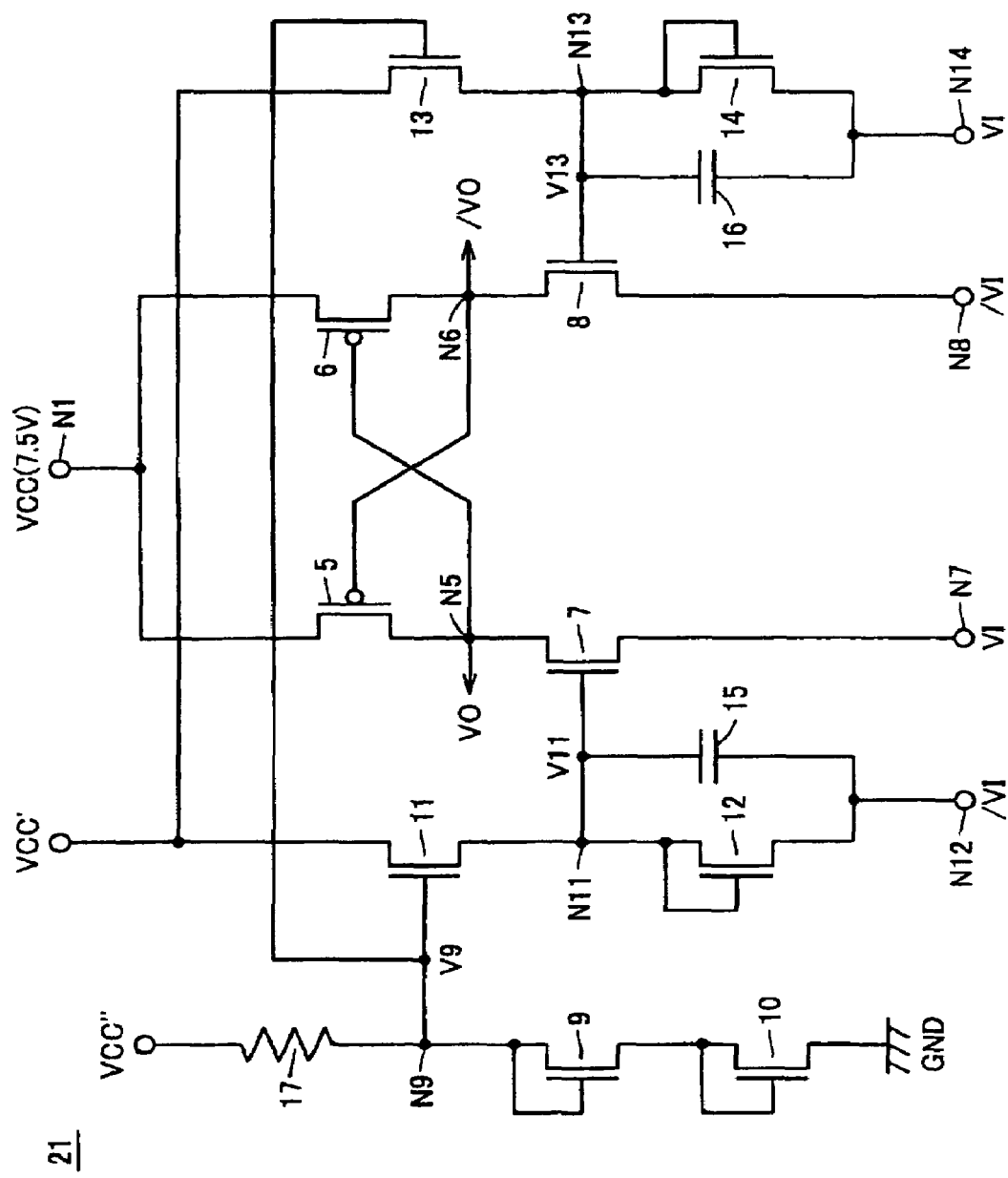

A level shifter 21 shown in FIG. 4 includes P-type TFTs 5 and 6 having respective sources receiving a power supply potential VCC (7.5 V), an N-type TFT 11 having its drain receiving a positive power supply potential VCC' different from power supply potential VCC, and a resistor element 17 having one electrode (which is not the electrode connected to node N9) receiving a power supply potential VCC" which is different from power supply potentials VCC and VCC'. According to this modification, potentials V9, V11 and V13 on respective nodes N9, N11 and N13 are prevented from changing, the change being caused by noises generated on the node of power supply potential VCC for example.

Figure 5:
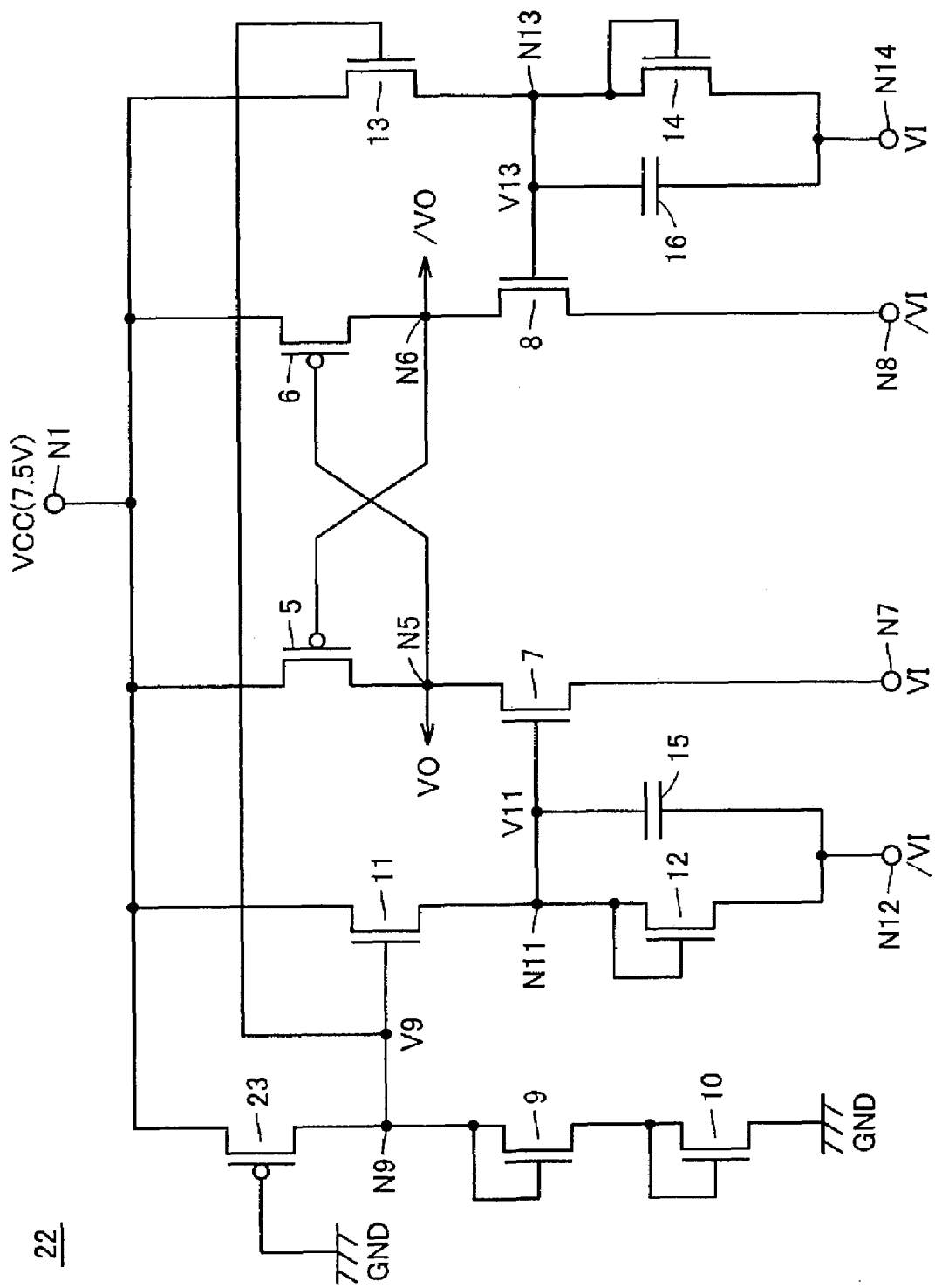

A level shifter 22 shown in FIG. 5 includes a resistor element 17 constituted of a P-type TFT 23. Specifically, P-type TFT 23 is connected between a node N1 of power supply potential VCC and a node N9 and has its gate connected to a node of ground potential GND. The resistance value per unit area of the resistor element constituted of the TFT is greater than the resistance value per unit area of a resistor element constituted of a diffusion layer. Then, according to this modification, the area occupied by the resistor element can be reduced. The same effect is achieved if resistor element 17 is constituted of an N-type TFT having its gate receiving power supply potential VCC.

Figure 6:
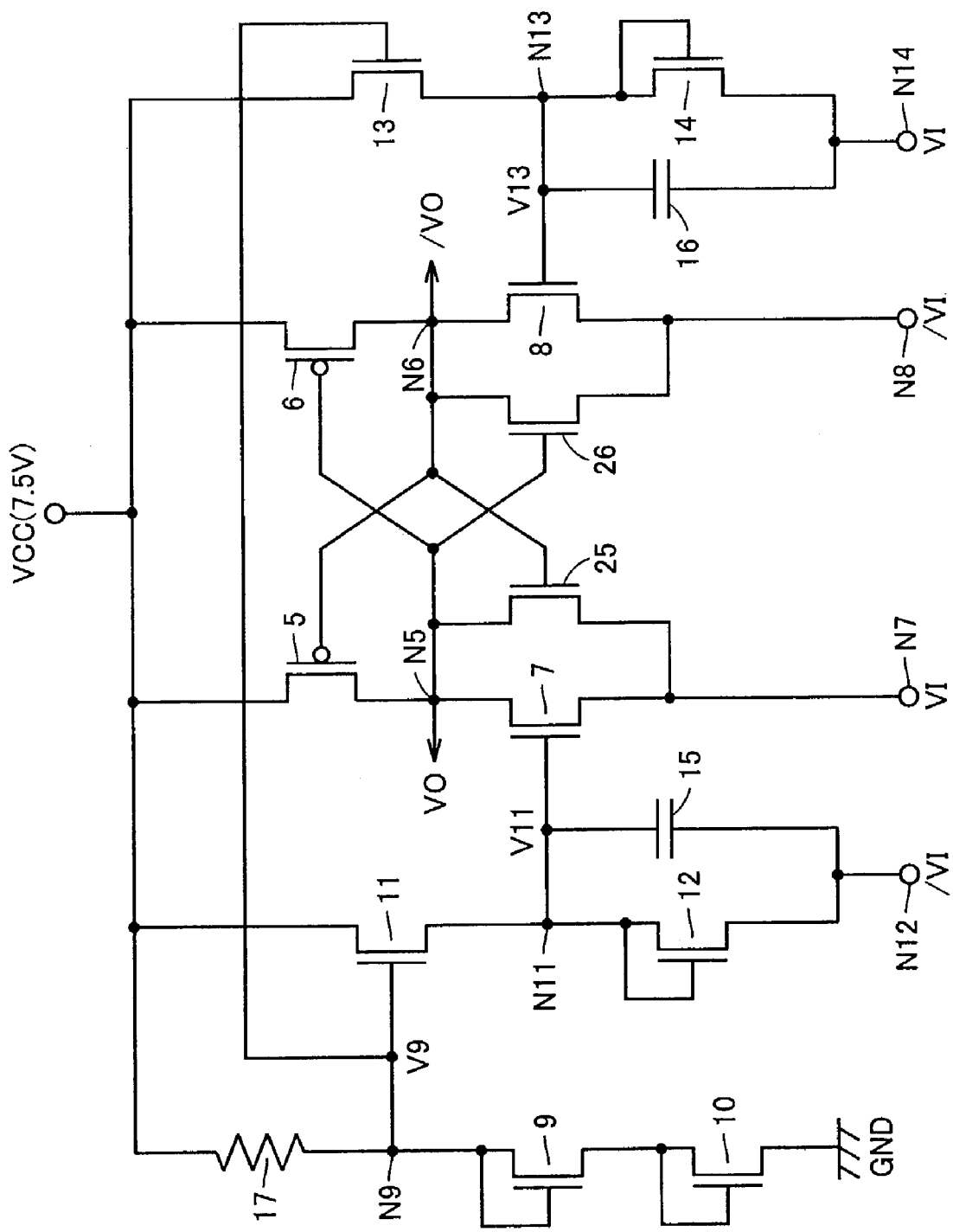

A level shifter 24 shown in FIG. 6 additionally includes N-type TFTs 25 and 26. N-type TFT 25 is connected between nodes N5 and N7 and has its gate connected to a node N6. N-type TFT 26 is connected between nodes N6 and N8 and has its gate connected to node N5. When input signals VI and /VI have H and L levels respectively and output signals VO and /VO have H and L levels respectively, N-type TFT 25 is turned off and N-type TFT 26 is turned on and output nodes N5 and N6 are kept at H and L levels respectively. When input signals VI and /VI change to L and H levels respectively and output signals VO and /VO change to L and H levels respectively, N-type TFT 25 is turned on and N-type TFT 26 is turned off and output nodes N5 and N6 are kept at L and H levels respectively.

If input signals VI and /VI change at considerably long intervals, potentials V11 and V13 of respective nodes N11 and N13 both could be equal to threshold voltage VTN of the N-type TFTs, resulting in an inverted potential relation between output nodes N5 and N6. N-type TFTs 25 and 26 are provided for avoiding such an inverted potential relation between output nodes N5 and N6 and serve to fix the potential on output nodes N5 and N6 regardless of potentials V11 and V13 on nodes N11 and N13.

Figure 7:
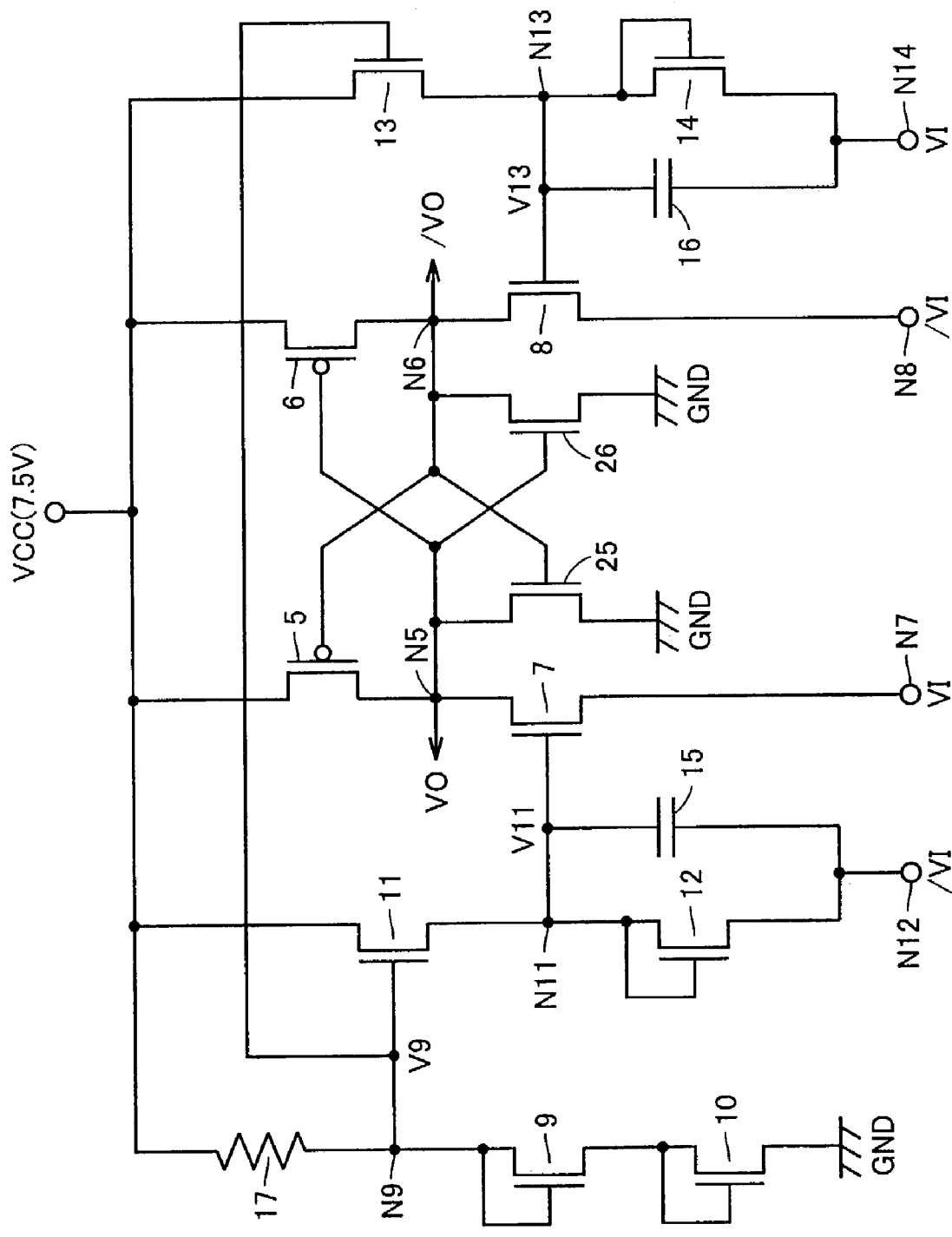

A level shifter 27 shown in FIG. 7 includes N-type TFTs 25 and 26 of level shifter 24 shown in FIG. 6, that have respective sources connected to the node of ground potential GND. According to this modification, the current through N-type TFTs 25 and 26 is not directed to input nodes N7 and N8 but to the node of ground potential GND. Only a small drive power is required for input signals VI and /VI.

Figure 8:
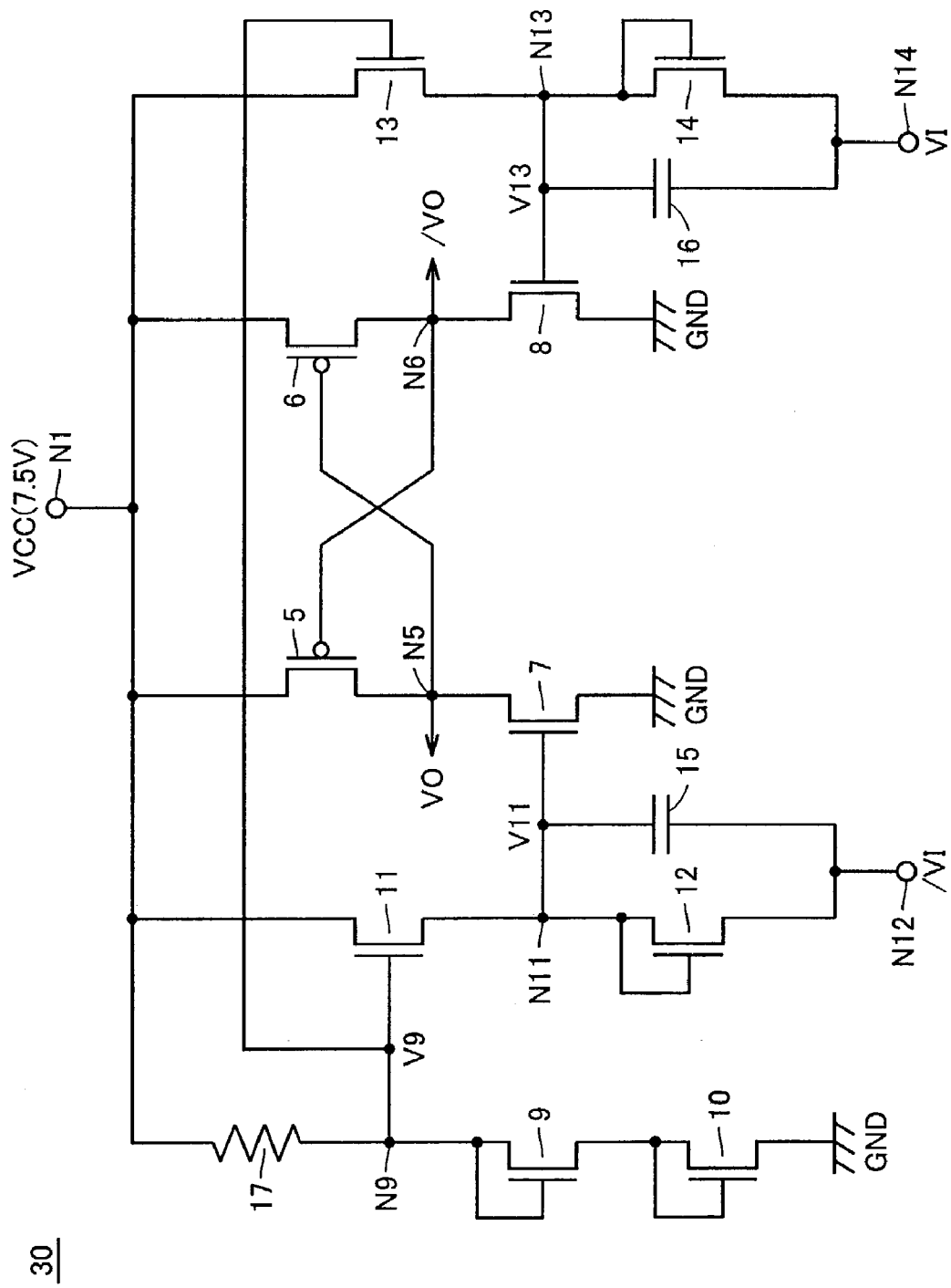

A level shifter 30 shown in FIG. 8 includes N-type TFTs 7 and 8 of level shifter 3 shown in FIG. 2 that have respective sources both connected to the node of ground potential GND. According to this modification, the current through N-type TFTs 7 and 8 is not directed to input nodes N7 and N8 but to the node of ground potential GND, so that only a small drive power is required for input signals VI and /VI.

Figure 9:
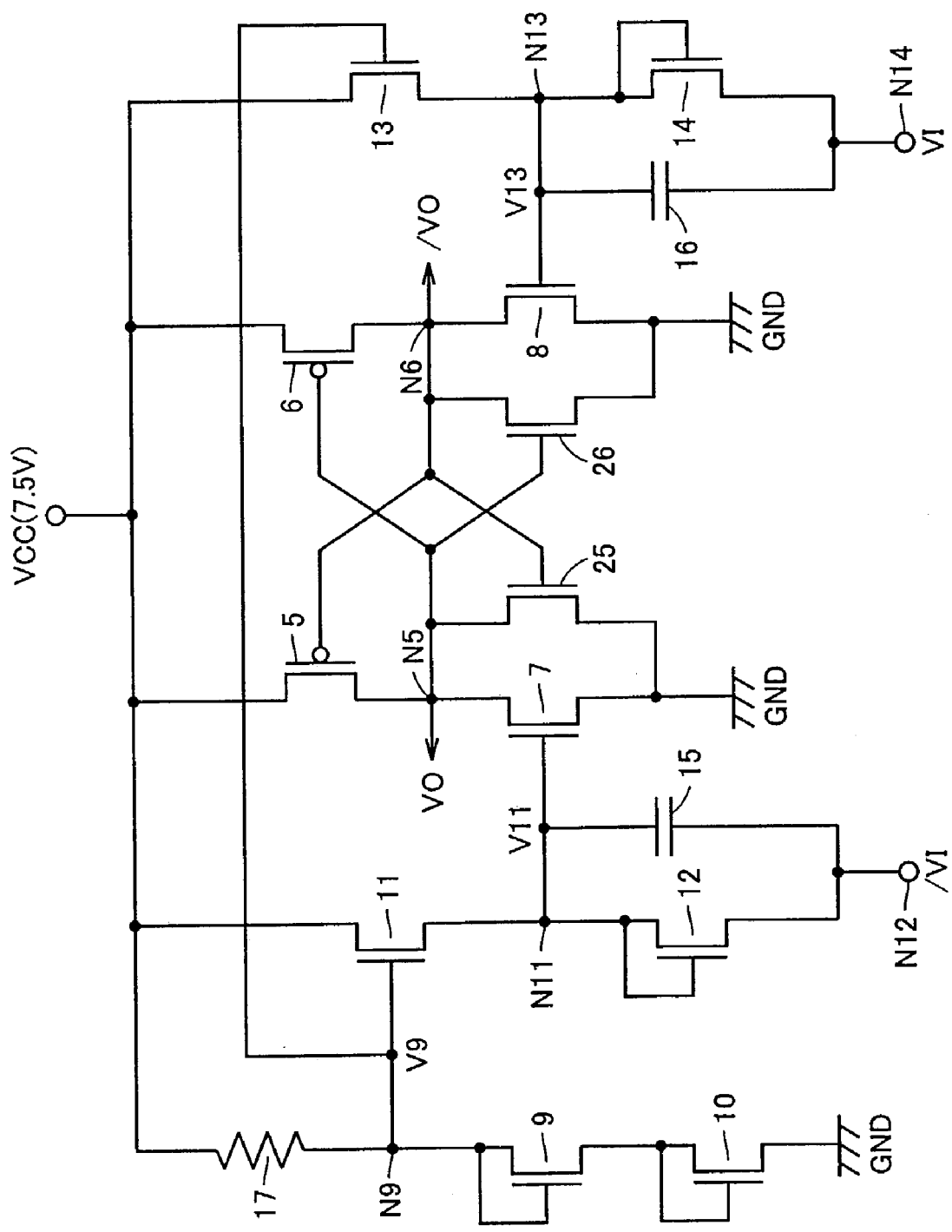

A level shifter 31 shown in FIG. 9 includes N-type TFTs 7, 8, 25 and 26 of level shifter 27 shown in FIG. 7 that have respective sources connected to nodes of ground potential GND. According to this modification, current through N-type TFTs 7, 8, 25 and 26 is directed not to input nodes N7 and N8 but to the nodes of ground potential GND. Thus, further smaller drive power is merely required for input signals VI and /VI.

Figure 10:
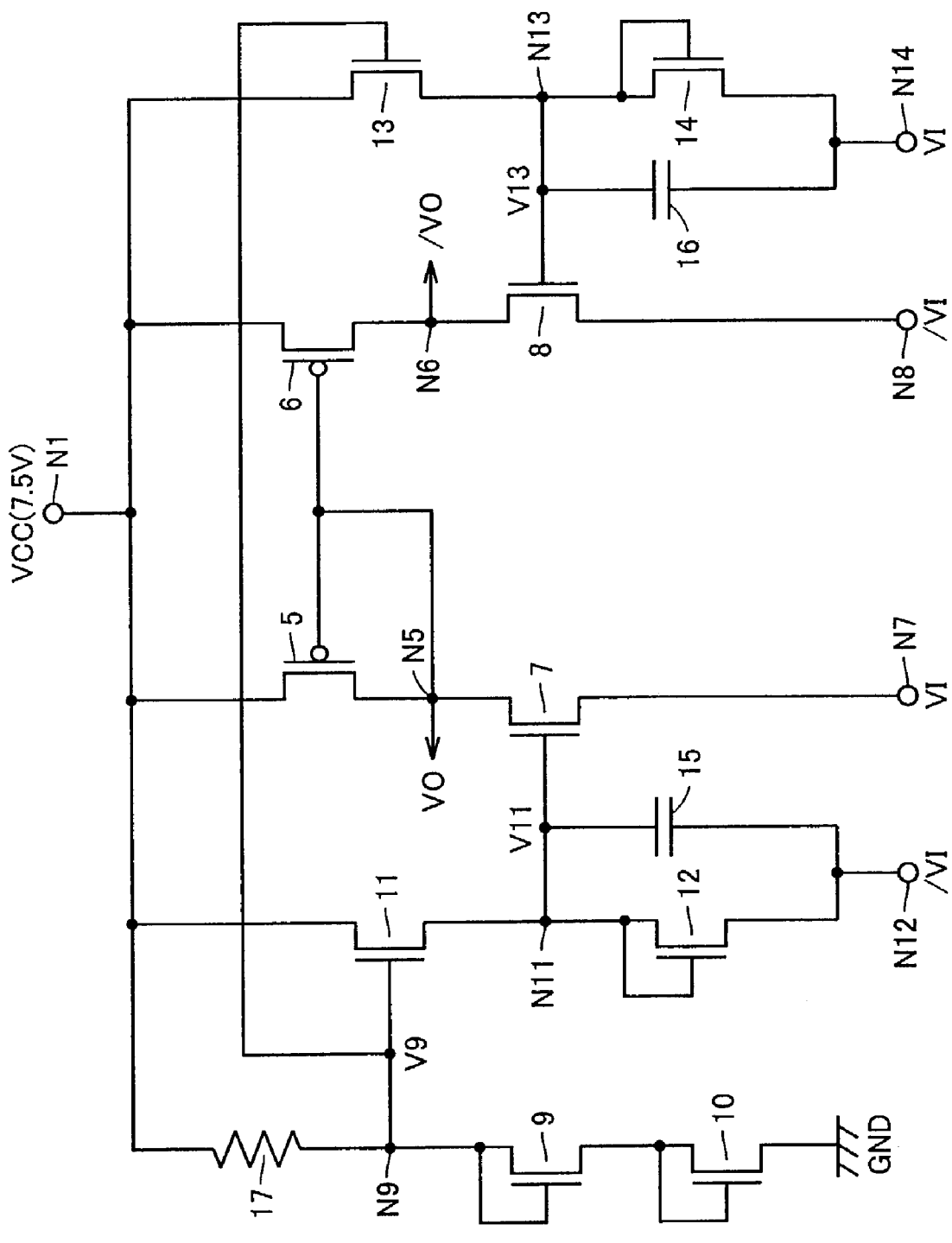

A level shifter 32 shown in FIG. 10 includes P-type TFTs 5 and 6 of level shifter 3 shown in FIG. 2 that have respective gates both connected to a node N5. P-type TFTs 5 and 6 constitute a current mirror circuit. Current of the same current value flows through P-type TFTs 5 and 6. When input signals VI and /VI have L and H levels respectively and N-type TFTs 7 and 8 are turned on and off respectively, current of the same current value as that flowing through TFTs 5 and 7 flows through P-type TFT 6 to accomplish differential amplification. Output nodes N5 and N6 have L and H levels respectively. According to this modification, the effect of amplitude conversion that is the same as the effect of level shifter 3 is achieved.

Figure 11:
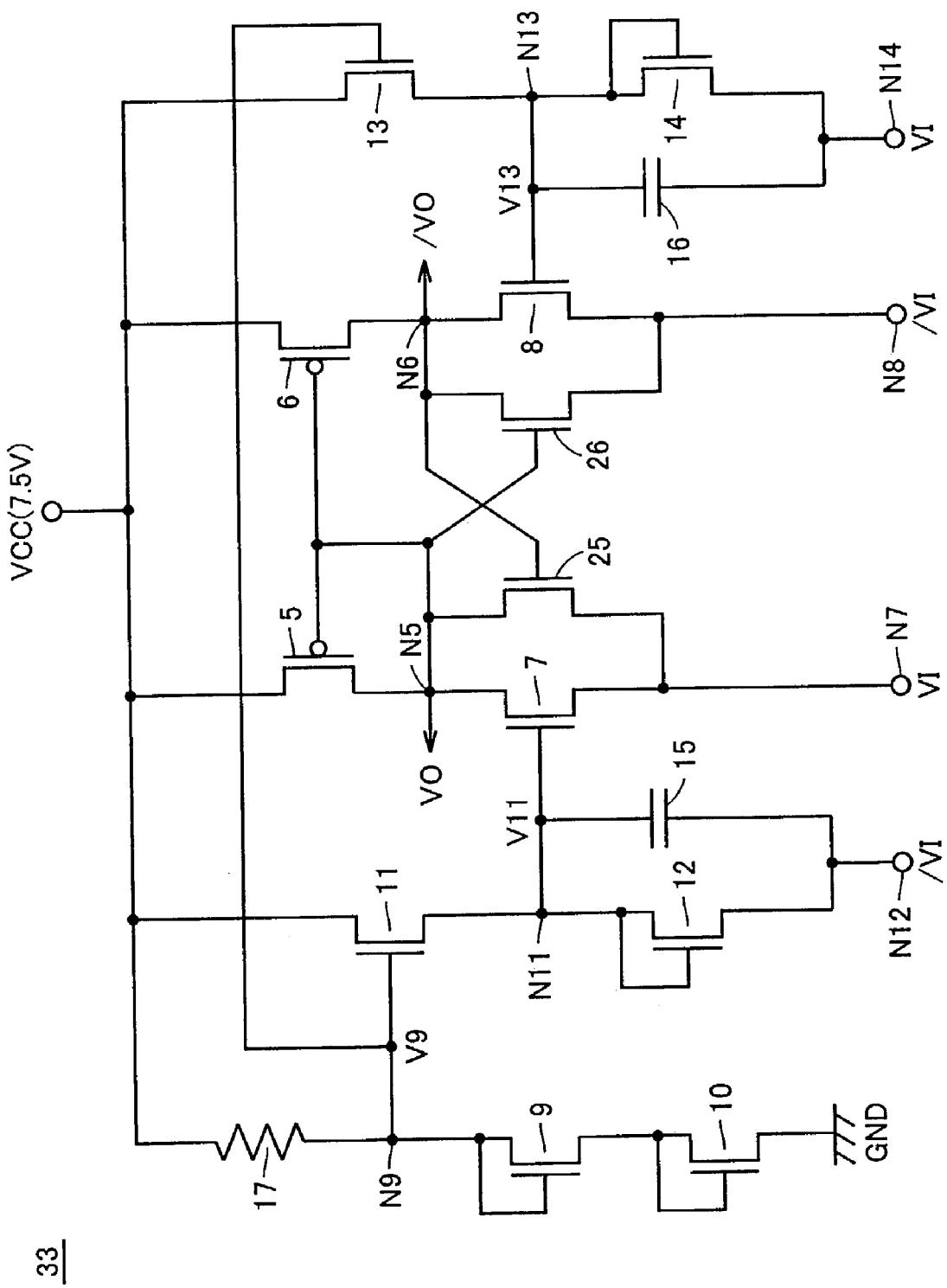

A level shifter 33 shown in FIG. 11 includes P-type TFTs 5 and 6 of level shifter 24 shown in FIG. 6 that have respective gates both connected to a node N5. According to this modification, the same effect as that of level shifter 24 in FIG. 6 is achieved.

Figure 12:
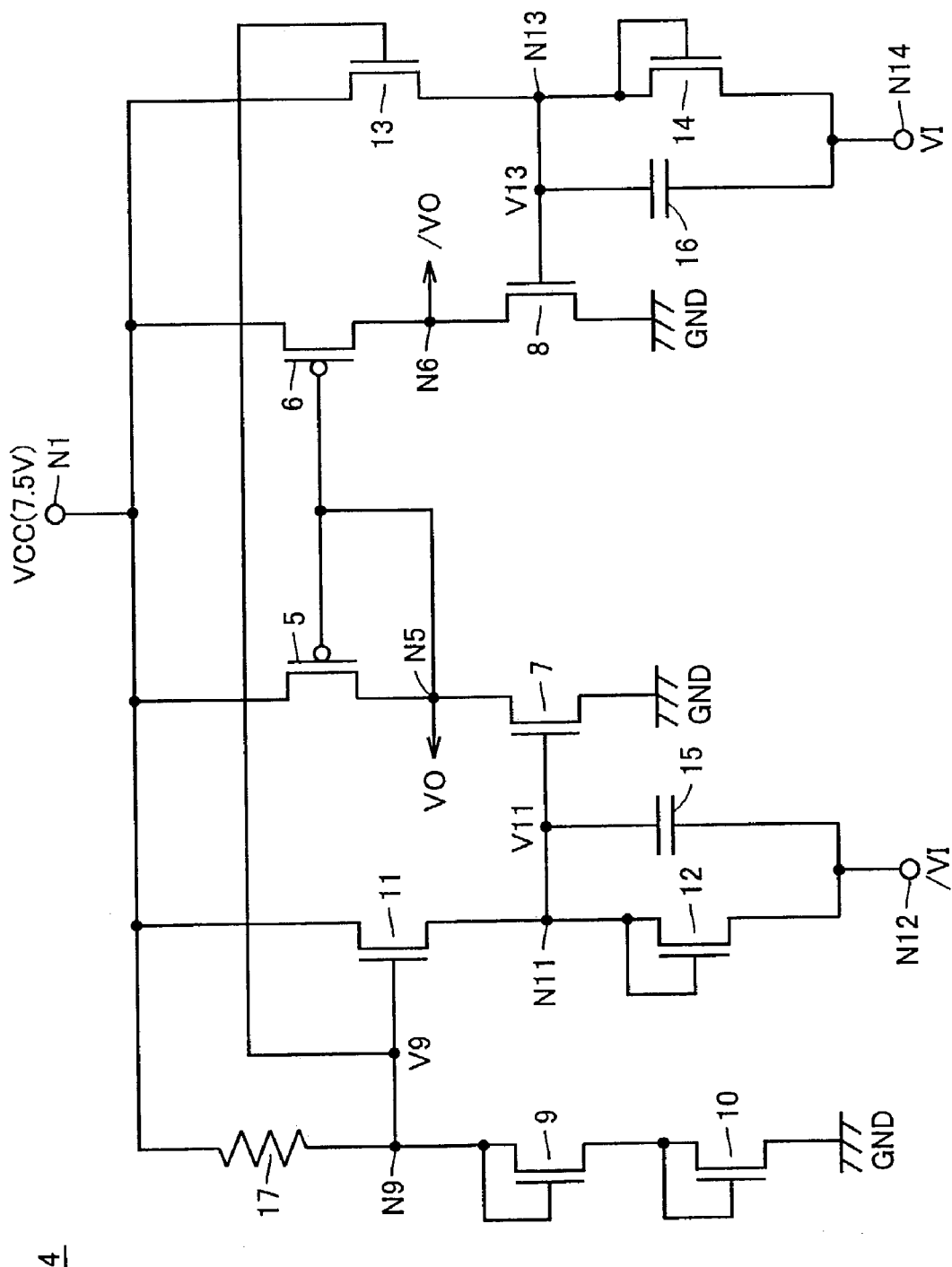

A level shifter 34 shown in FIG. 12 includes N-type TFTs 7 and 8 of level shifter 32 shown in FIG. 10 that have respective sources both grounded. According to this modification, the current through N-type TFTs 7 and 8 is directed not to input nodes N7 and N8 but to the node of ground potential GND. Then, only a small drive power is necessary for input signals VI and /VI.

Figure 13:
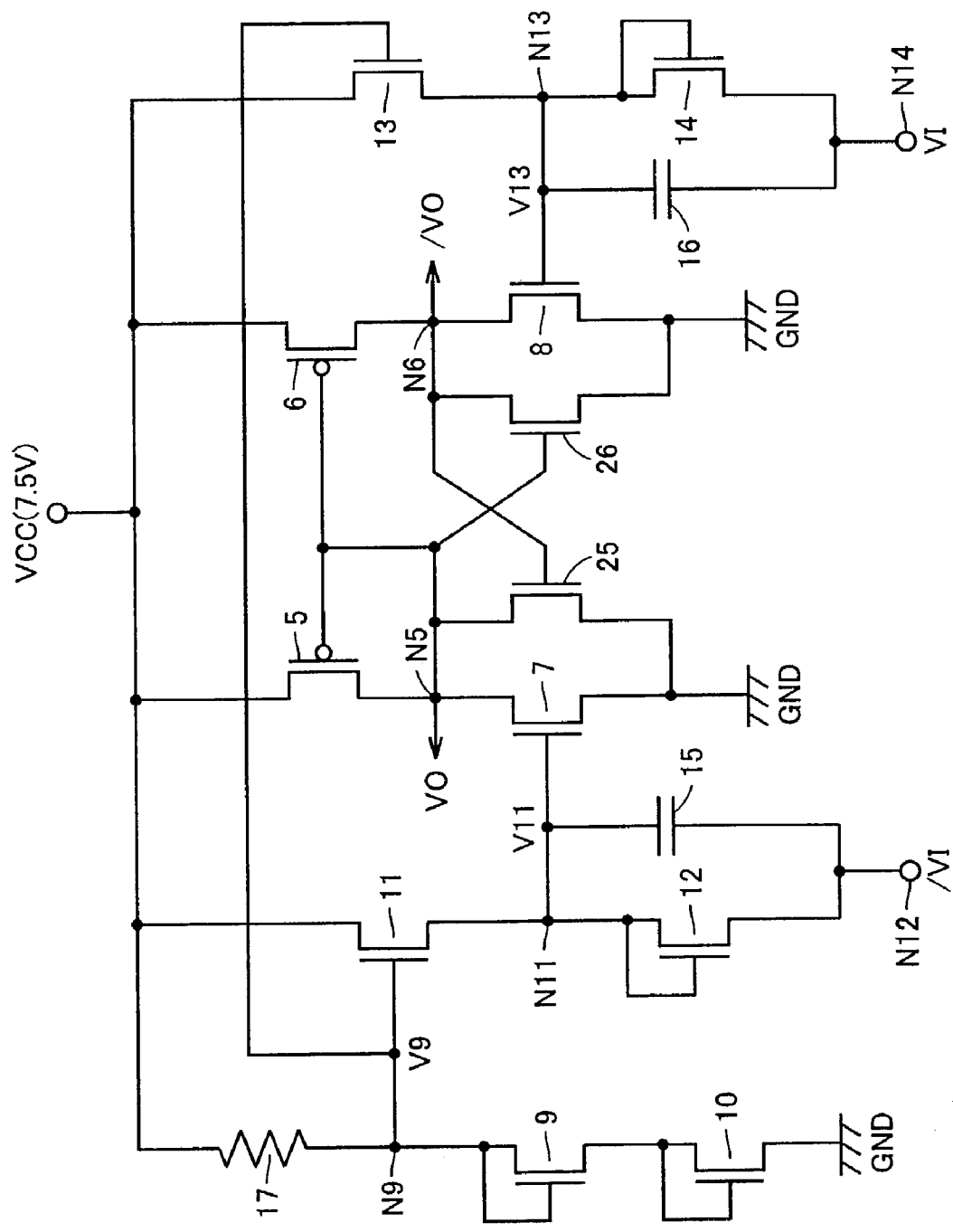

A level shifter 35 shown in FIG. 13 includes N-type TFTs 7, 8, 25 and 26 of level shifter 33 shown in FIG. 11 that have respective sources being grounded. According to this modification, the current through N-type TFTs 7, 8, 25 and 26 is directed not to input nodes N7 and N8 but to the node of ground potential GND. Then, only a small drive power is necessary for input signals VI and /VI.

Figure 14:
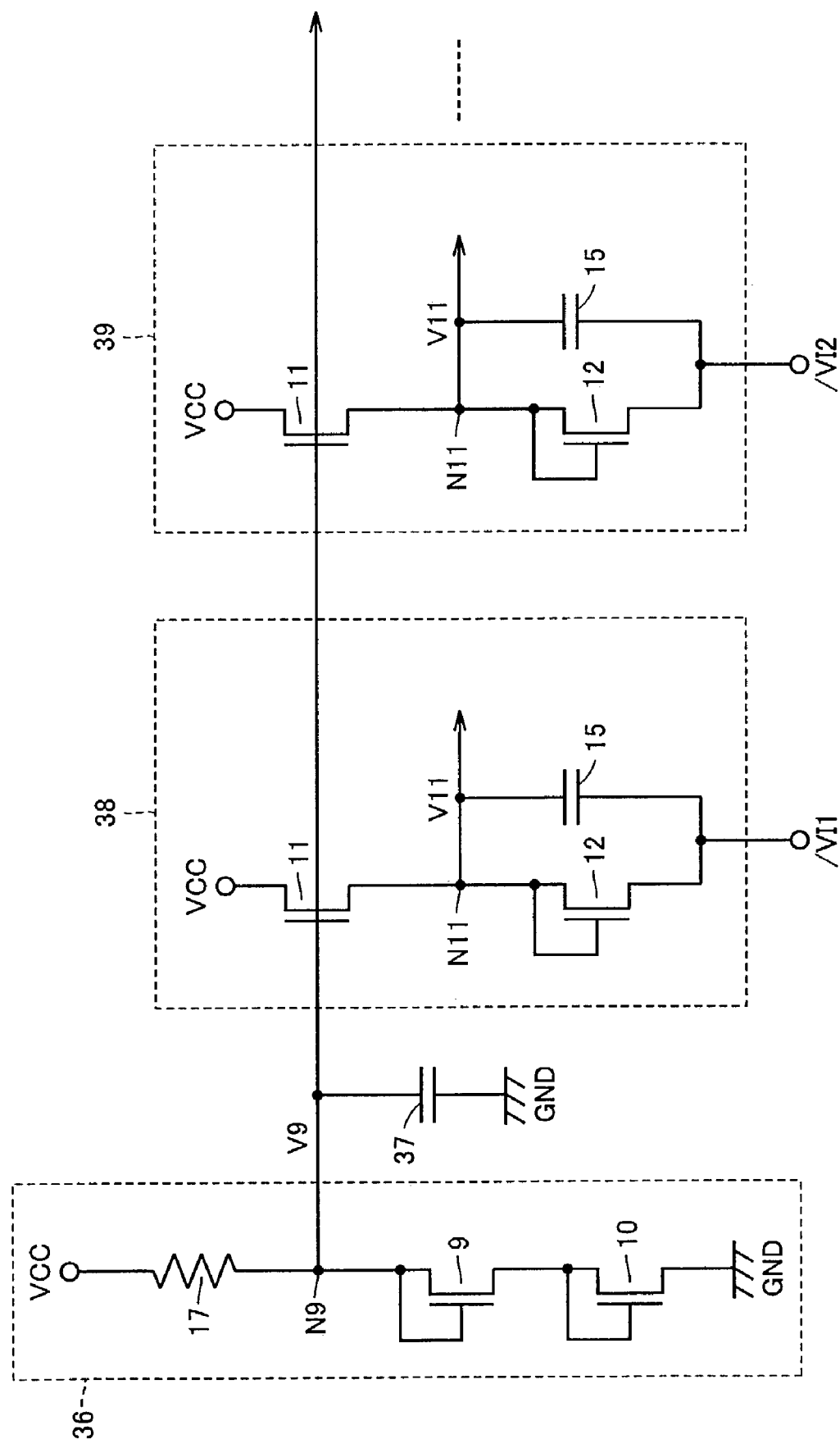

According to a modification shown in FIG. 14, a constant potential generating circuit 36 including a resistor element 17 and N-type TFTs 9 and 10 is provided to be shared by a plurality of level shifters 38, 39 . . . . A capacitor 37 for making potential stable is connected between an output node N9 of constant potential generating circuit 36 and a node of ground potential GND. Increase of the area of resistor element 17 is necessary for increasing the resistance value of resistor element 17. According to this modification, however, constant potential generating circuit 36 is provided to be shared by a plurality of level shifters 38, 39, . . . , which means that the overall circuit occupies a reduced area.

Figure 15:
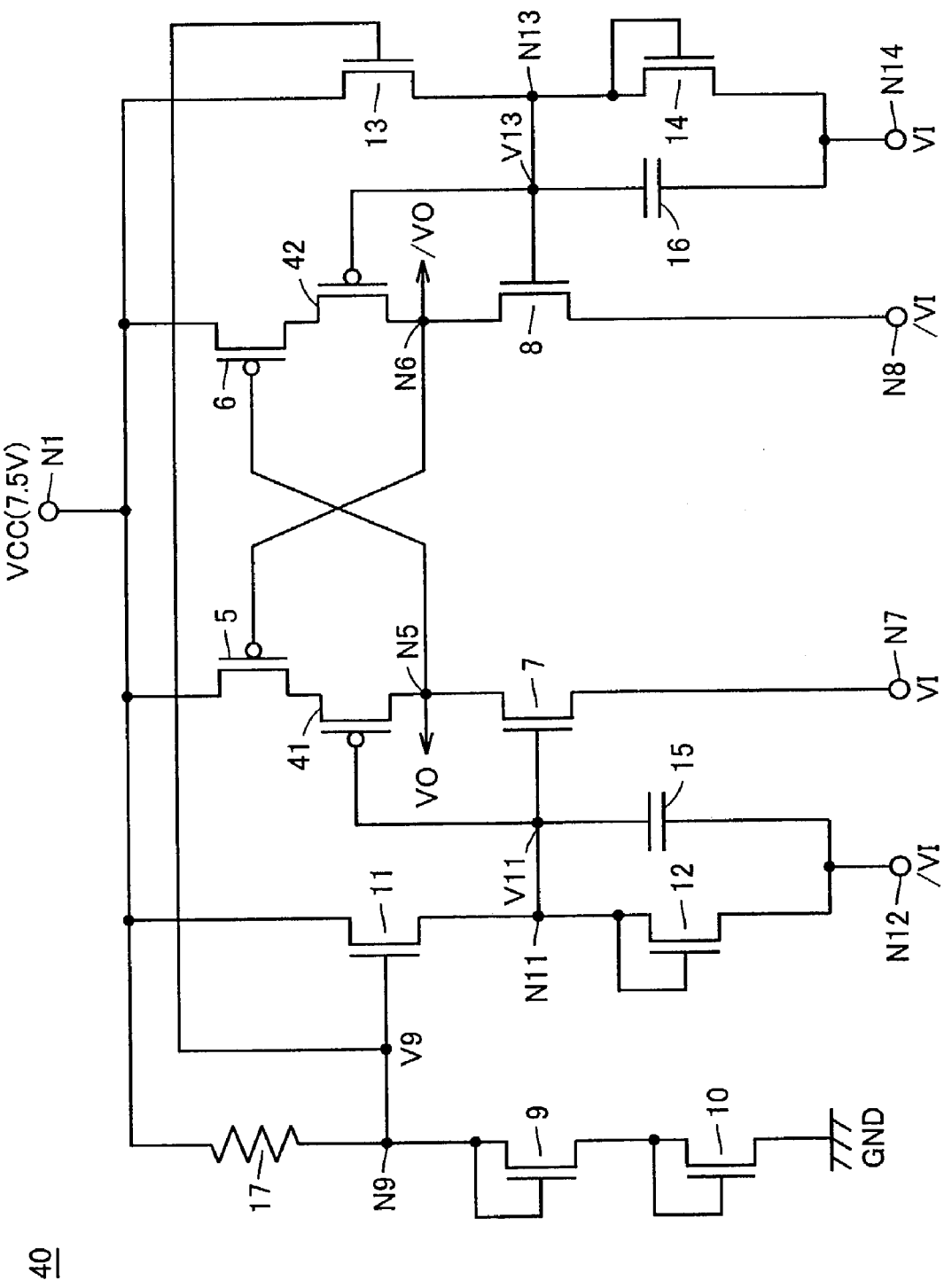
Figure 16:
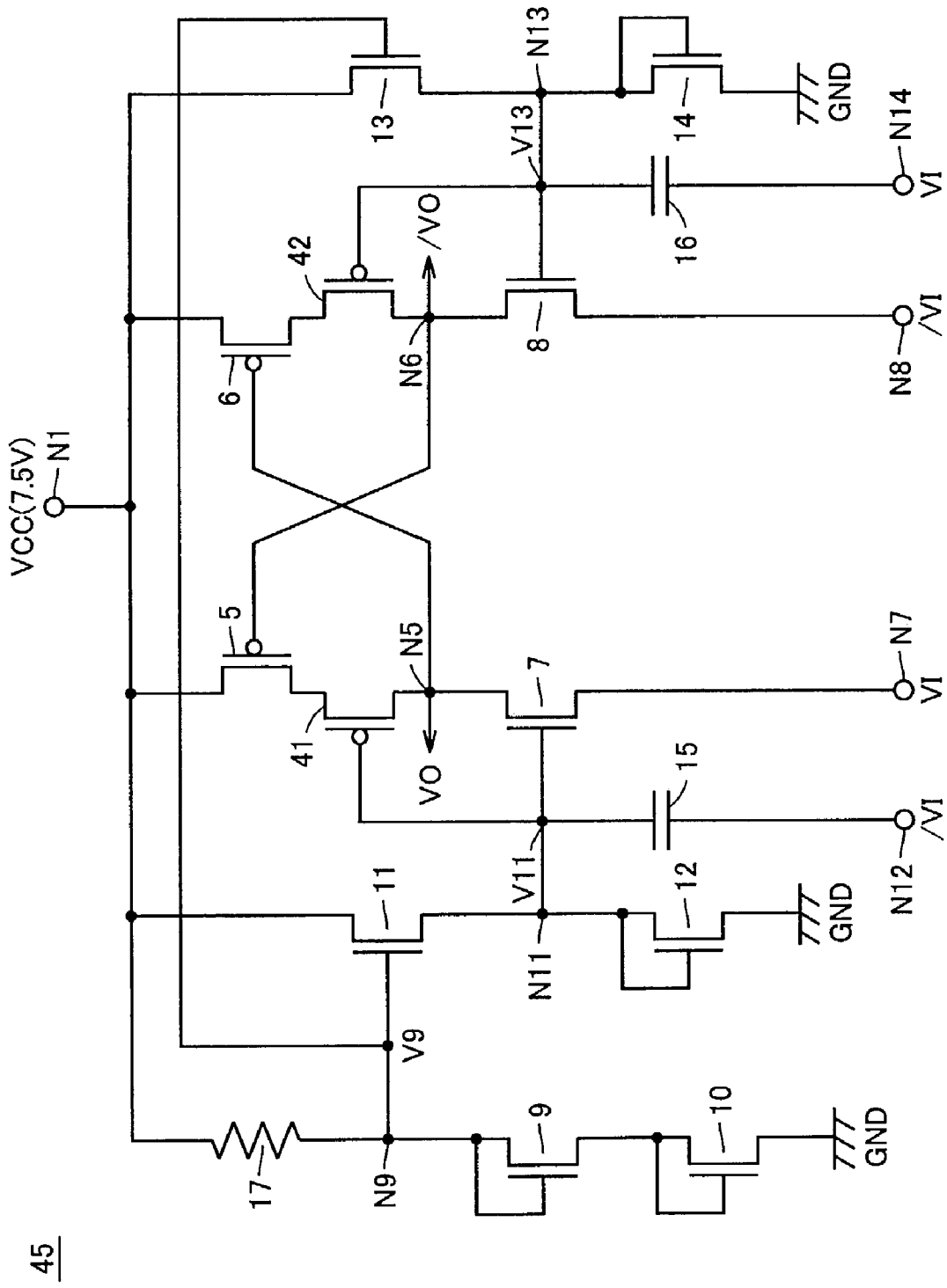
Figure 17:
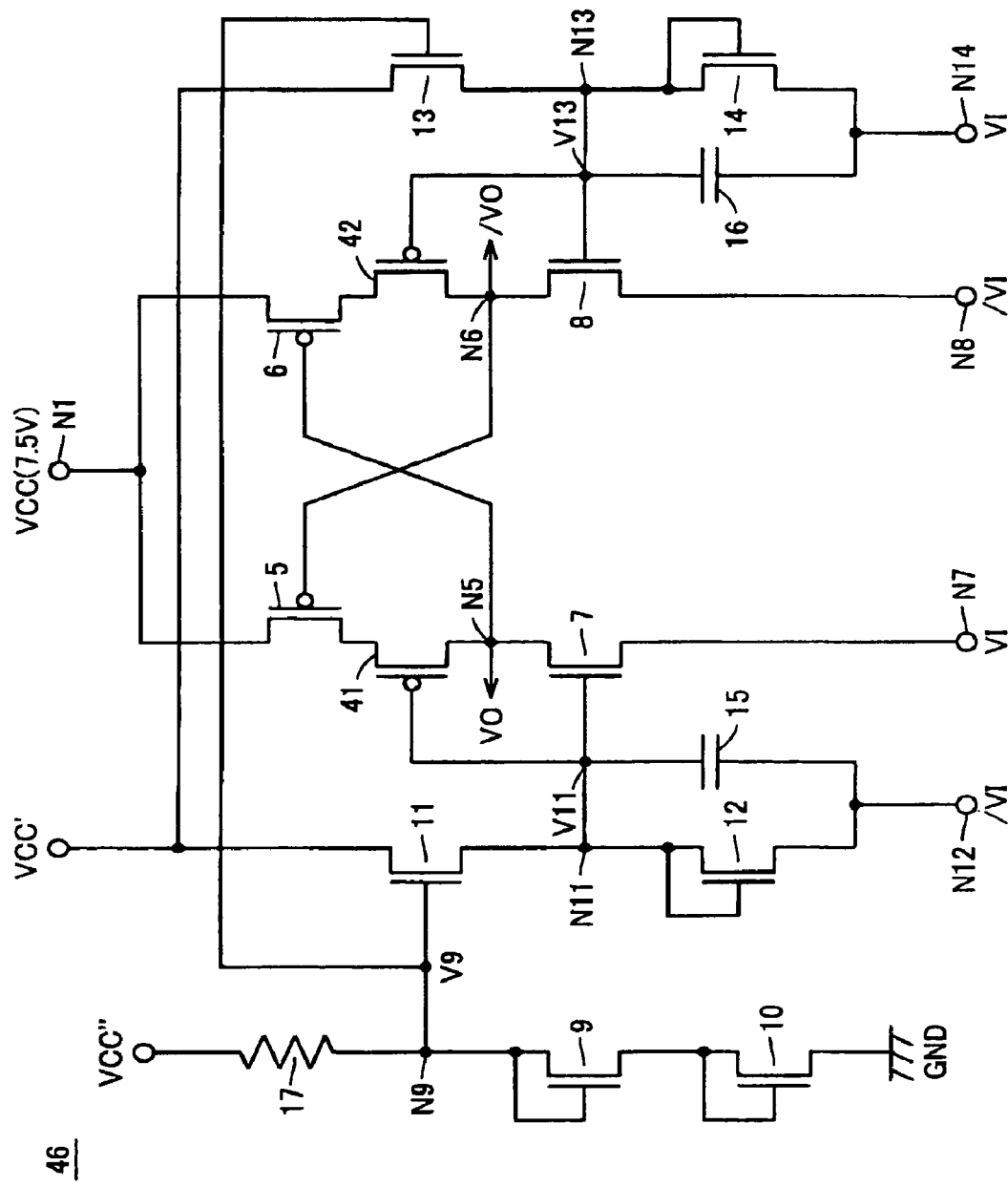
Figure 18:
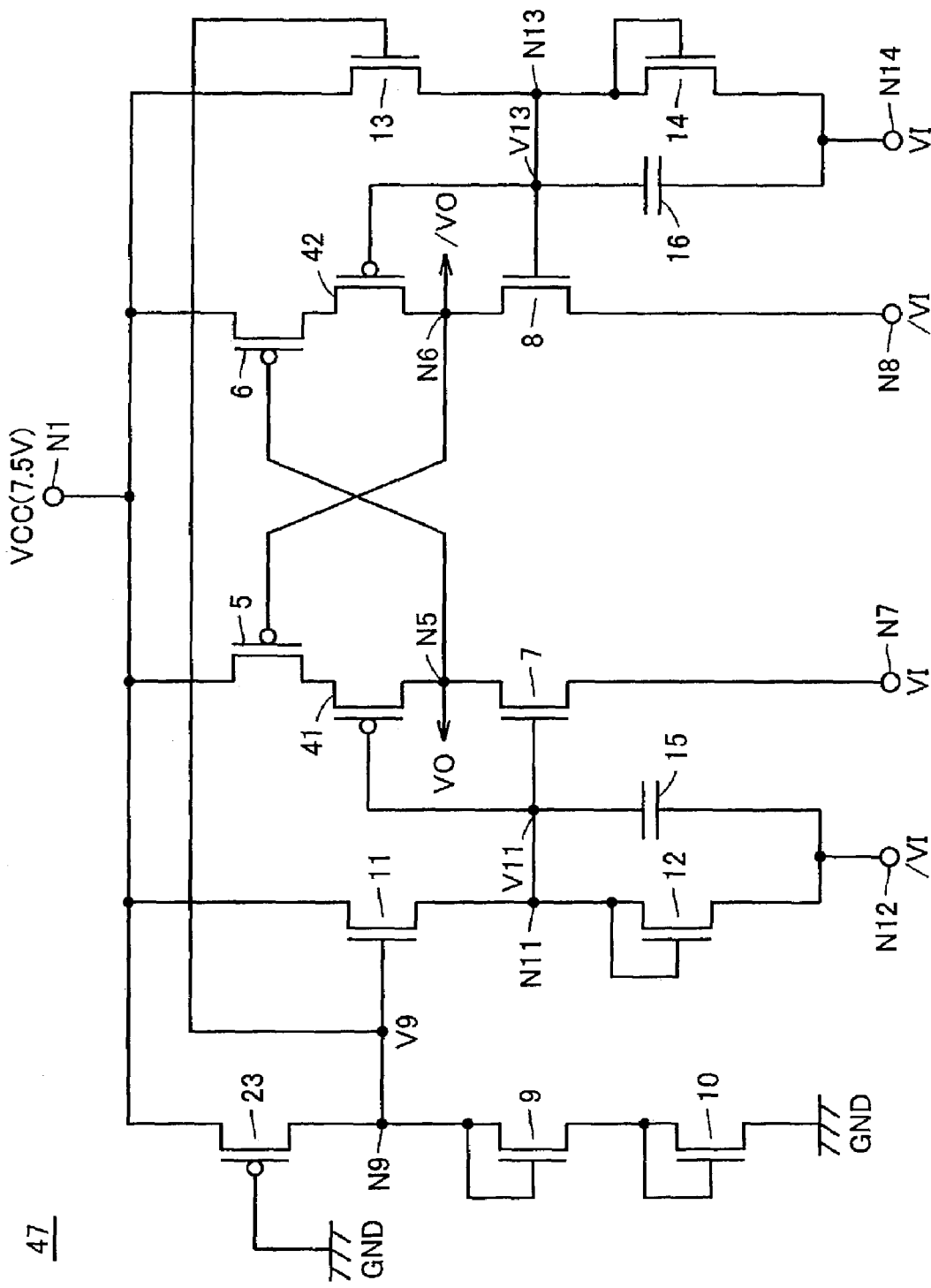
Figure 19:
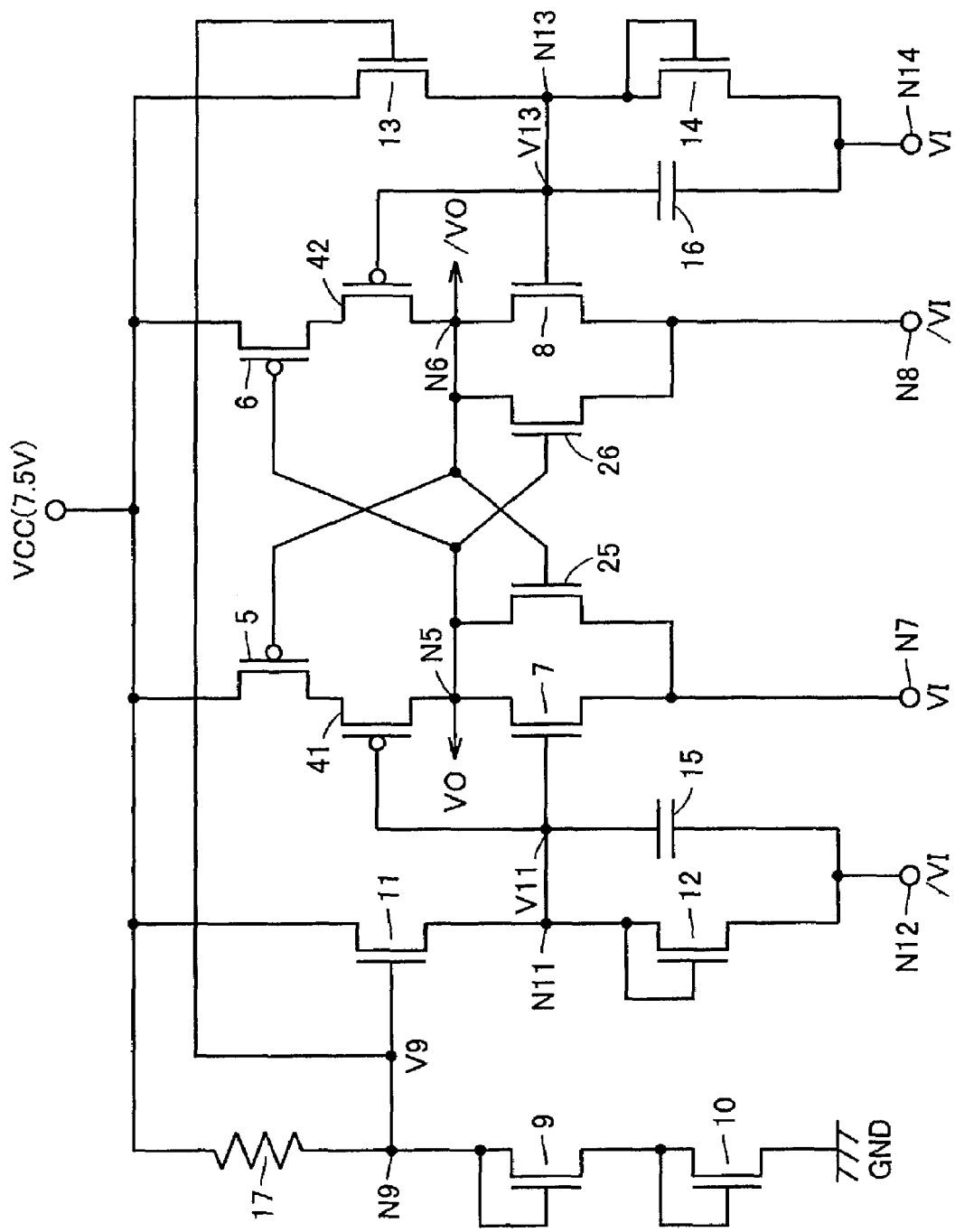
Figure 20:
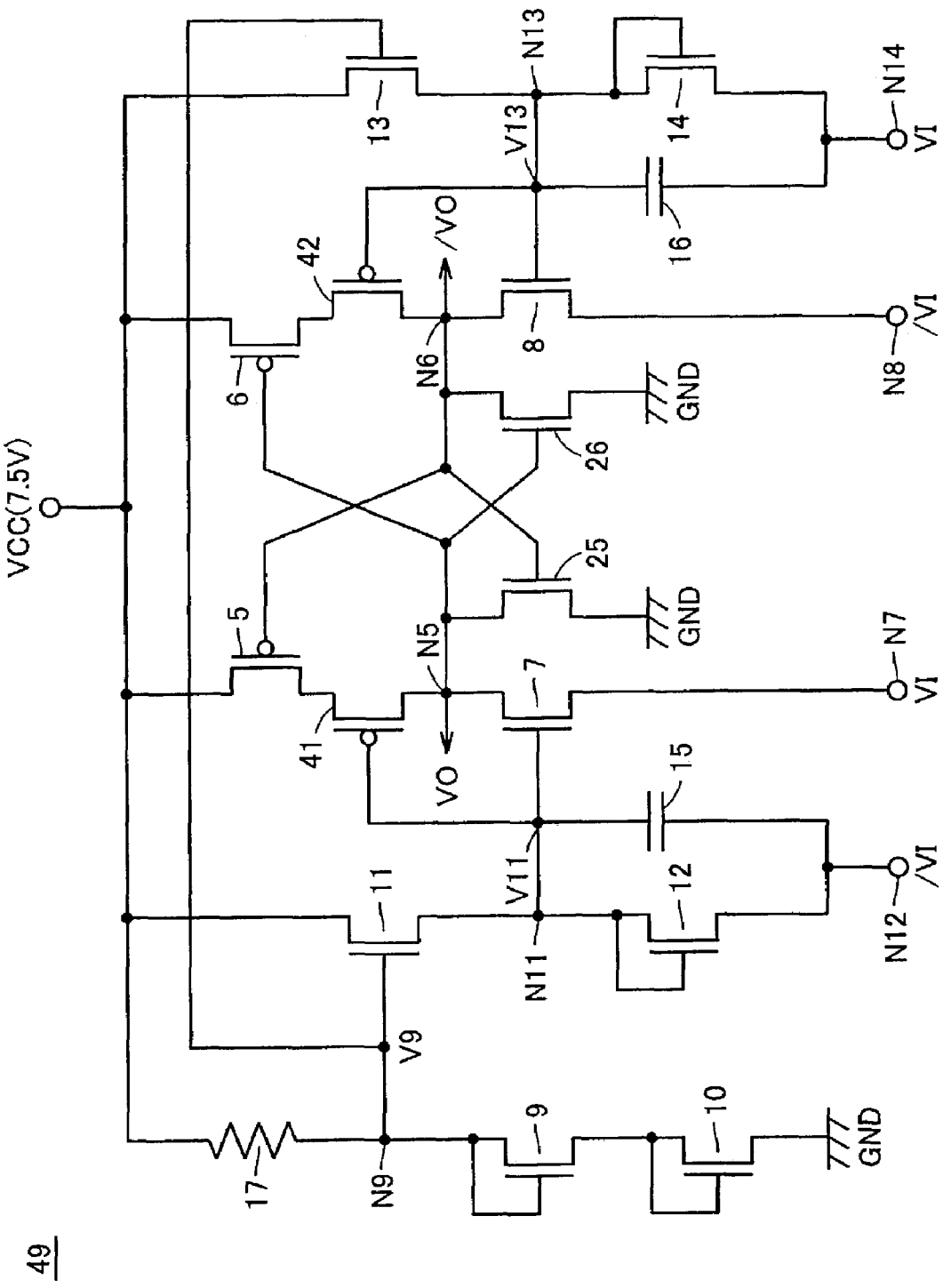
Figure 21:
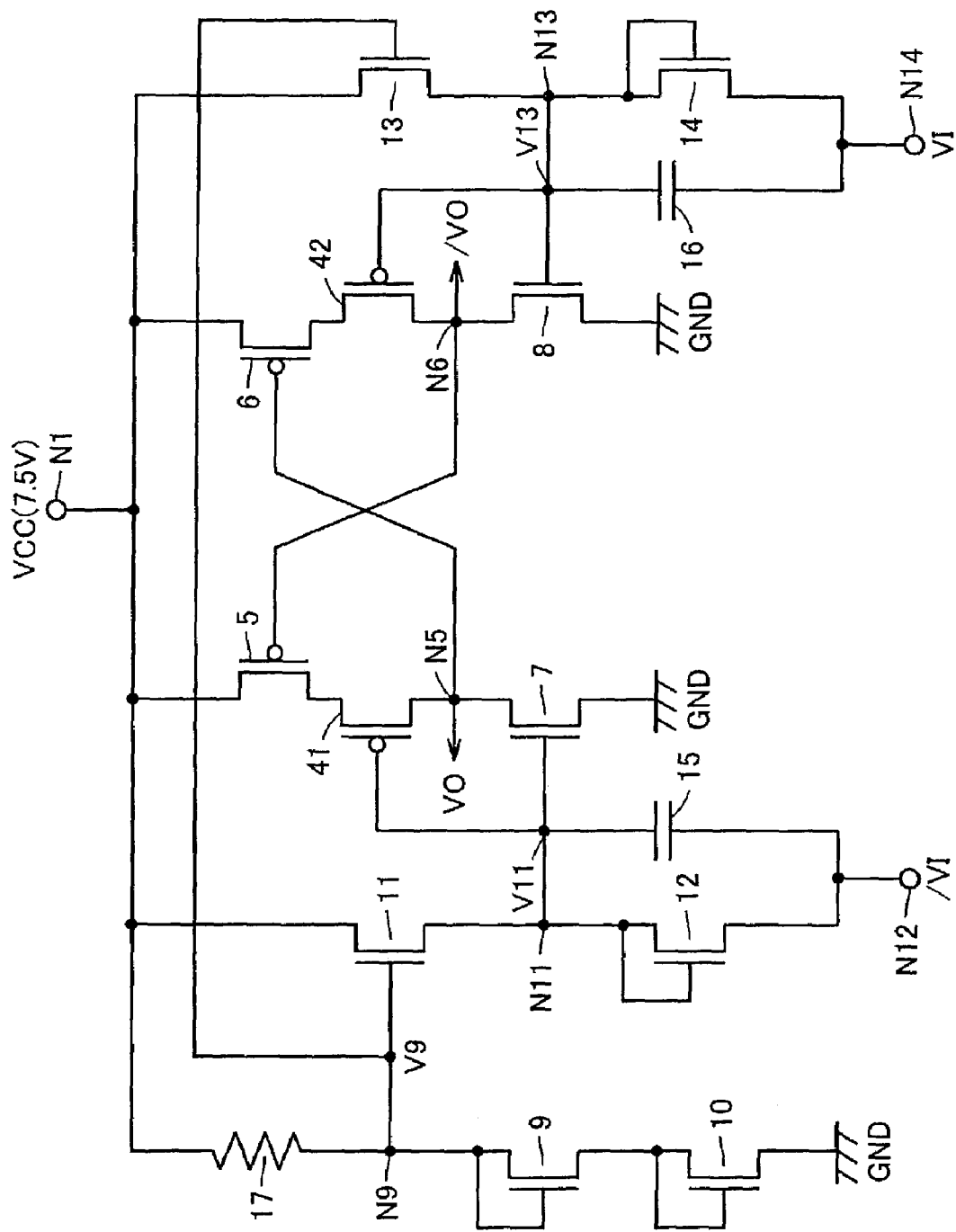
Figure 22:
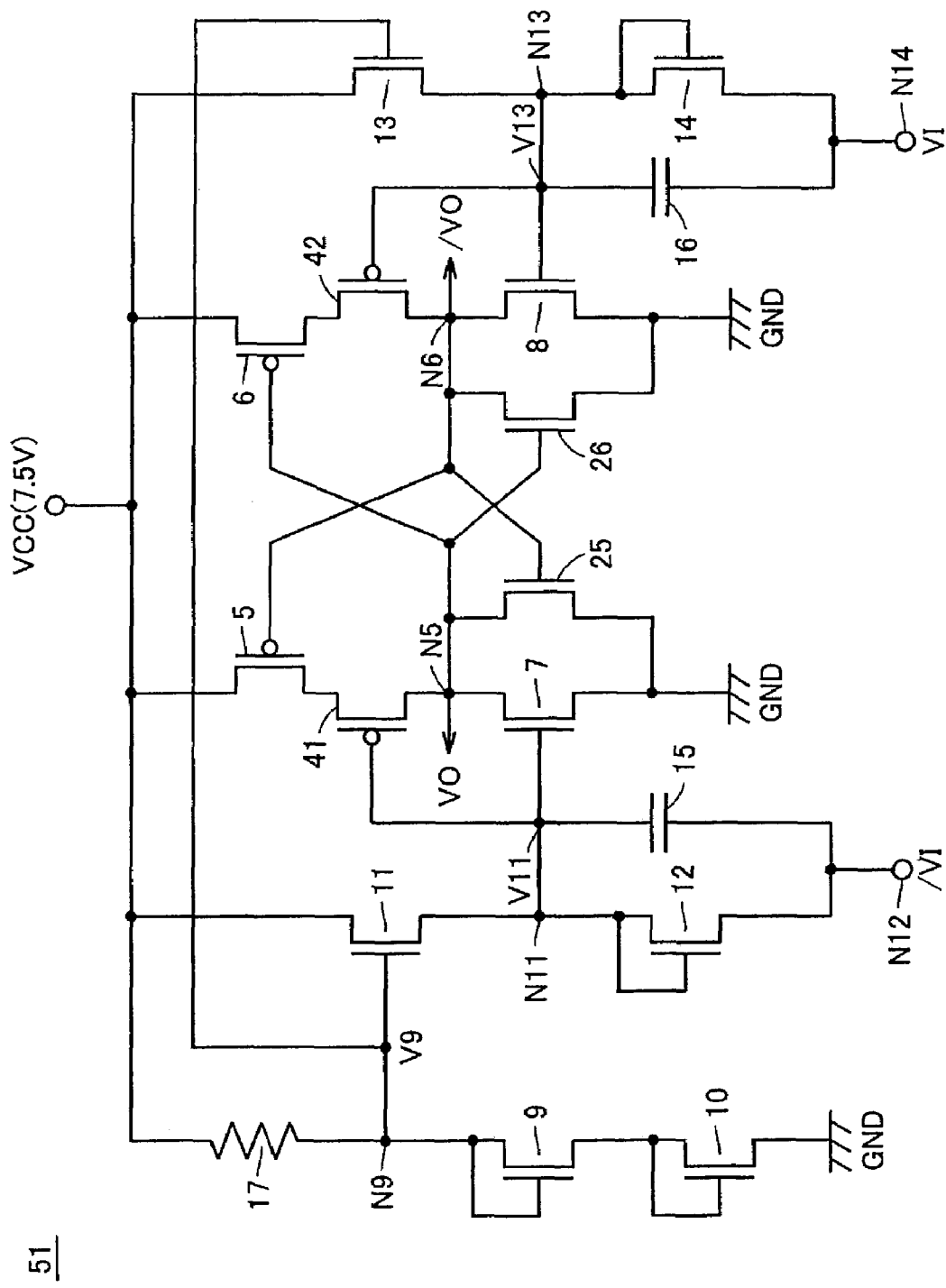
Figure 23:
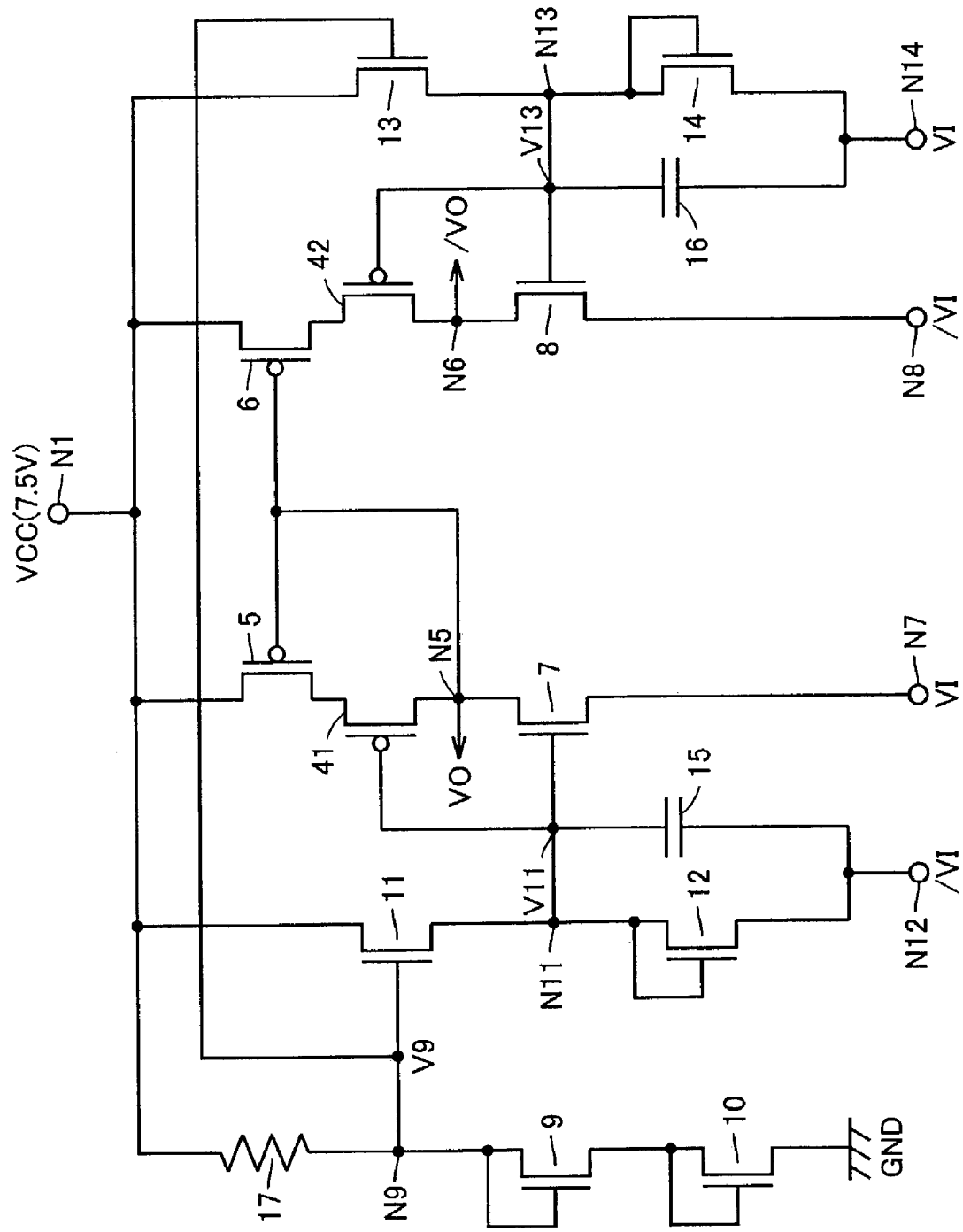
Figure 24:
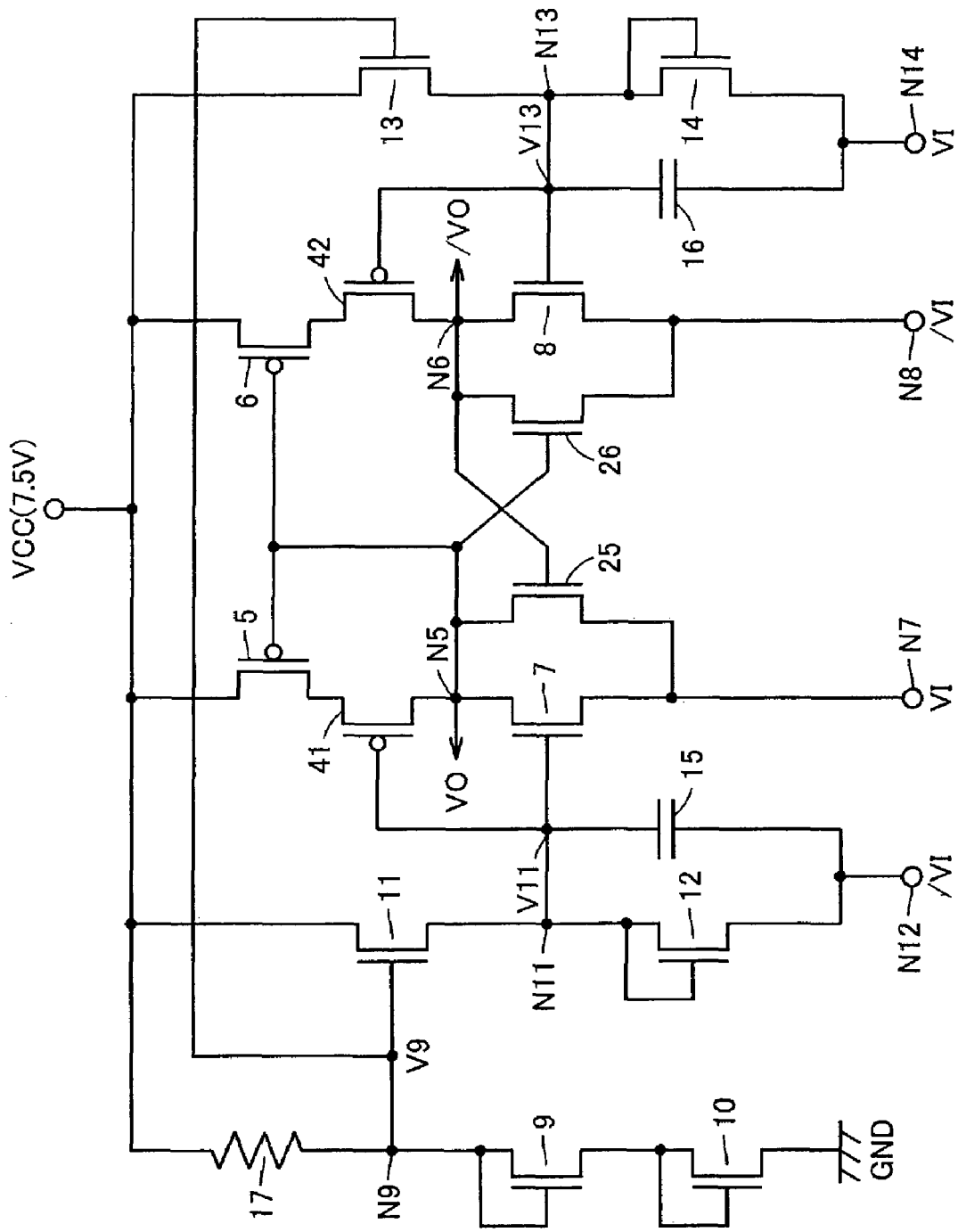
Figure 25:
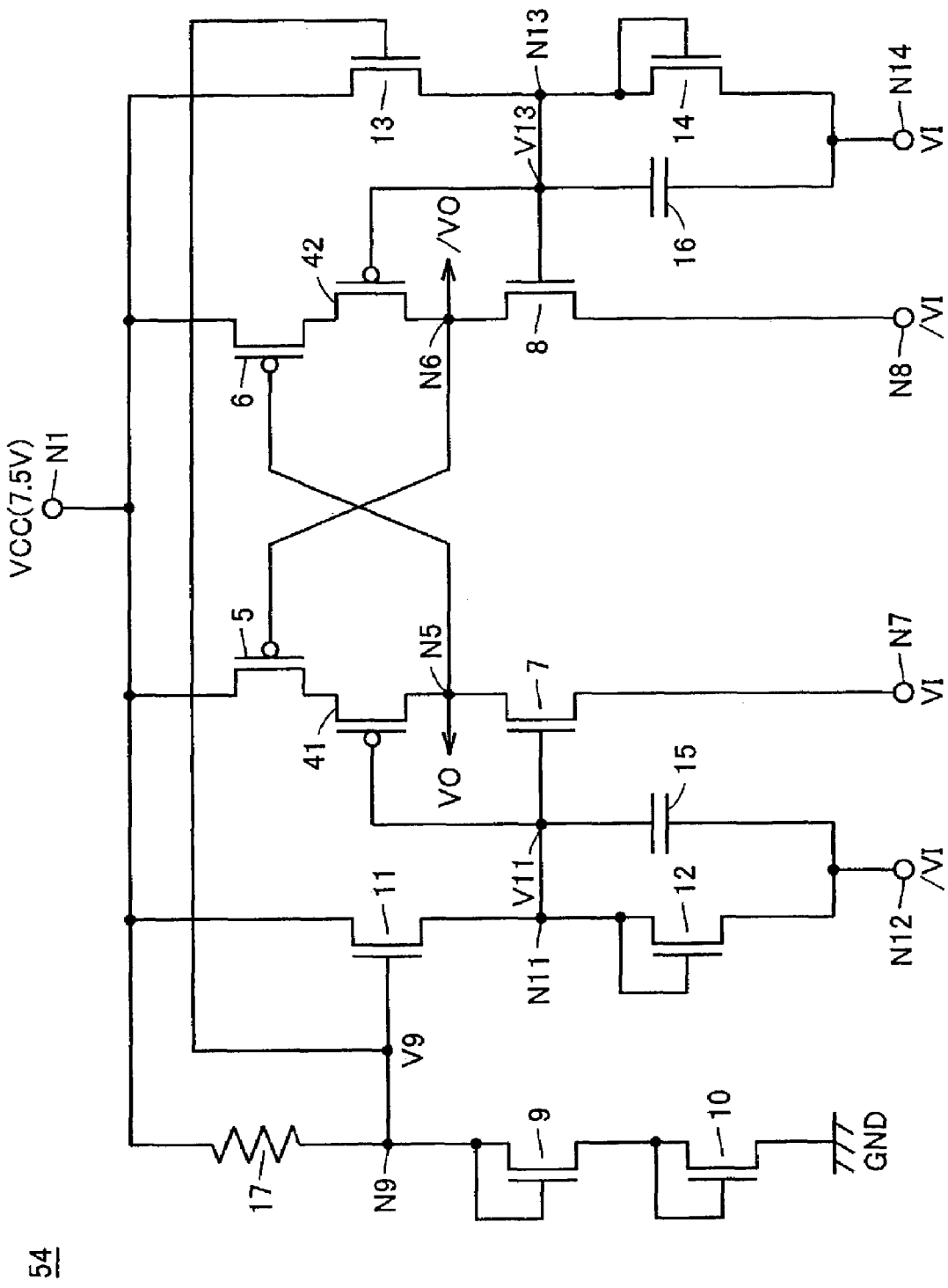
Figure 26:
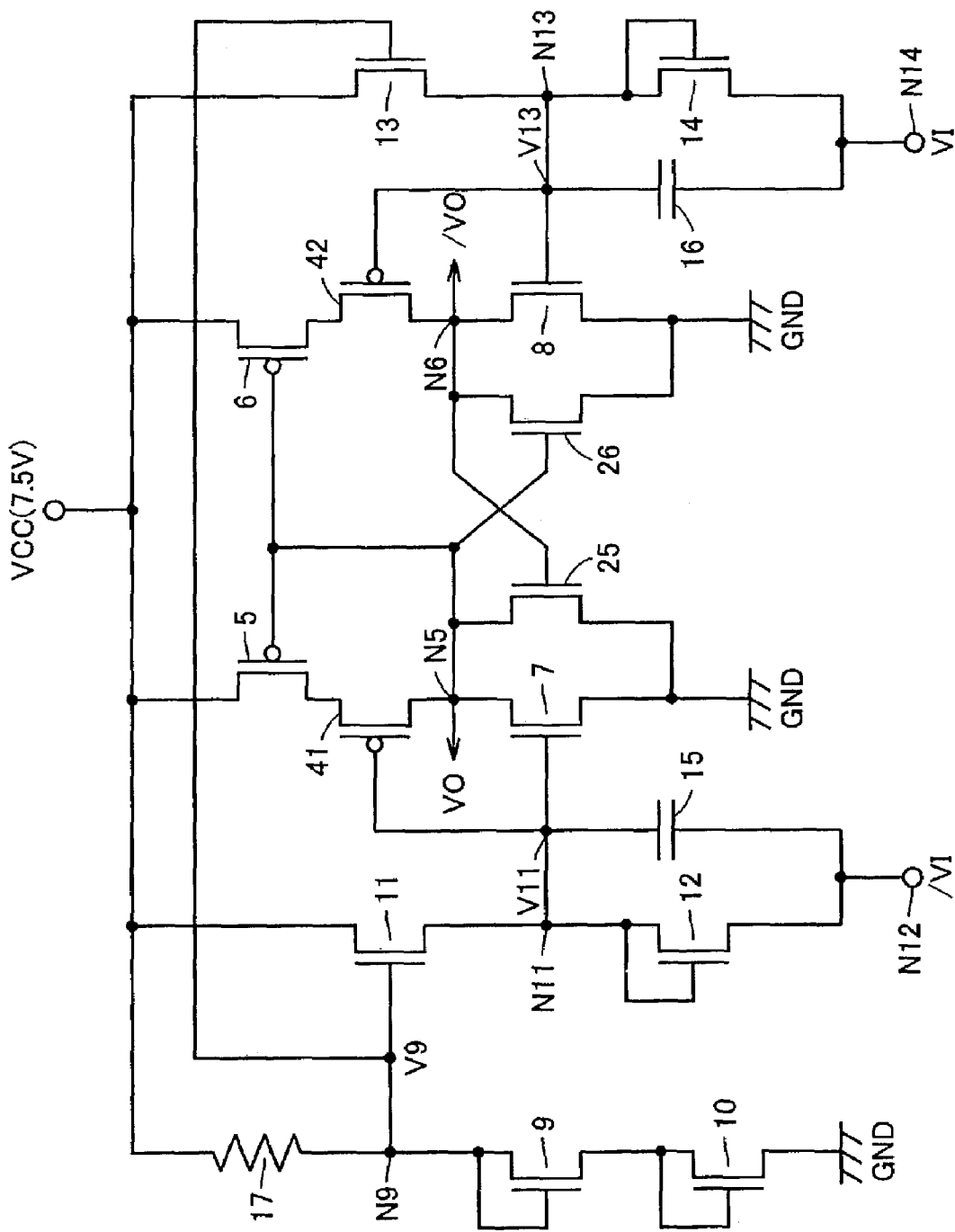
Figure 27:
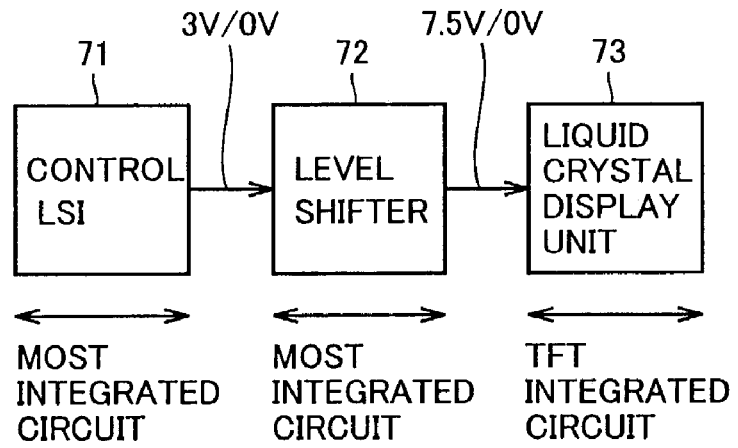
FIG. 27 is a block diagram showing a configuration of a part of a conventional cellular phone that is involved in image display.
Figure 28:
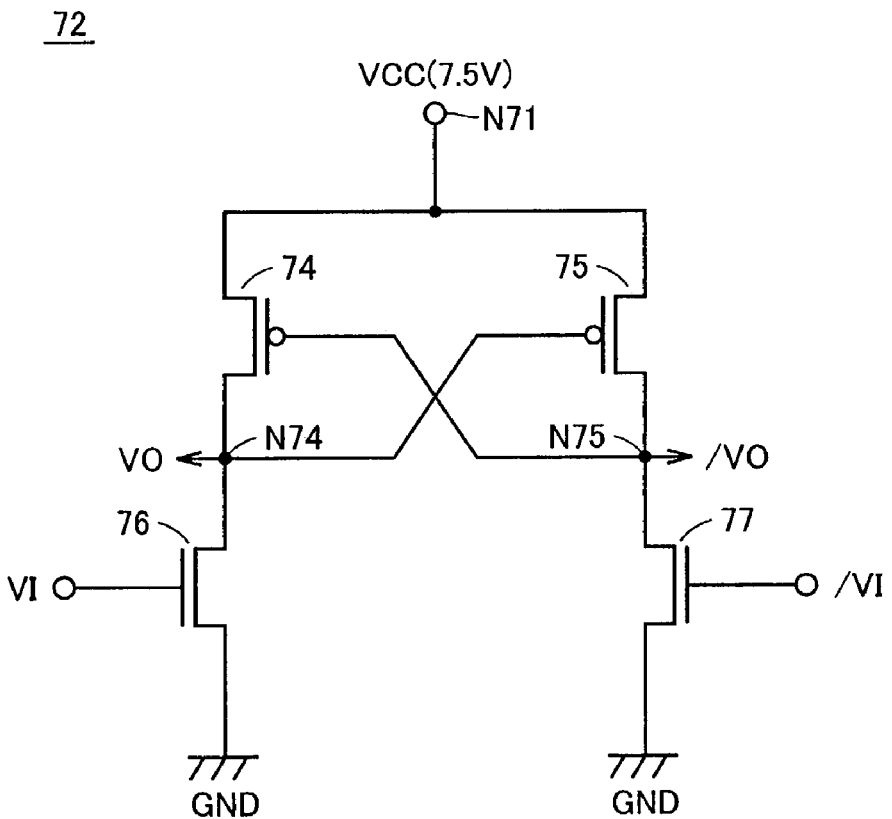
FIG. 28 is a circuit diagram showing a configuration of a level shifter shown in FIG. 27.

A level shifter 40 shown in FIG. 15 additionally includes P-type TFTs 41 and 42 as compared to level shifter 3 shown in FIG. 2. P-type TFT 41 is connected between the drain of P-type TFT 5 and output node N5 and has its gate connected to node N1. P-type TFT 42 is connected between the drain of P-type TFT 6 and output node N6 and has its gate connected to node N13. When input signal /VI is raised from 0 V to 3 V, potential V11 on node N11 is VTN+3 V and accordingly P-type TFT 41 is turned off while N-type TFT 7 is turned on and output node N5 has a potential of 0 V. At this time, as P-type TFT 41 is turned off, no current flows from node N1 of power supply potential VCC to output node N5, which helps the potential on output node N5 to decrease to 0 V. When input signal /VI is lowered from 3 V to 0 V, potential V11 on node N11 becomes VTN so that N-type TFT 7 is turned off while P-type TFT 41 is turned on and the potential on output node N5 increases to 7.5 V.

Further, when input signal VI is raised from 0 V to 3 V, potential V13 on node N13 is VTN+3 V so that P-type TFT 42 is turned off while N-type TFT 8 is turned on and the potential on output node N6 is 0 V. At this time, as P-type TFT 42 is turned off, no current flows from node N1 of power supply potential VCC to output node N6, which helps the potential on output node N6 to decrease to 0 V. When input signal VI is lowered from 3 V to 0 V, potential V13 on node N13 becomes VTN so that N-type TFT 8 is turned off while P-type TFT 42 is turned on and the potential on output node N6 increases to 7.5 V. According to this modification, decrease of respective potentials on output nodes N5 and N6 to 0 V is promoted, and accordingly the amplitude of input signals VI and /VI is reduced and the margin of the amplitude of input signals VI and /VI is increased.

Revel shifters 45–55 in respective FIGS. 16–26 correspond respectively to level shifters 20–22, 24, 27, 30–35 in respective FIGS. 3–13, and each additionally include P-type TFTs 41 and 42. These modifications also achieve the same effect as that of level shifter 40 shown in FIG. 15.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An amplitude conversion circuit converting a first signal having an amplitude corresponding to a first voltage into a second signal having an amplitude corresponding to a second voltage higher than said first voltage, comprising:

first and second transistors of a first conductivity type having respective first electrodes both receiving said second voltage, respective second electrodes connected respectively to first and second output nodes for providing said second signal and a complementary signal of said second signal, and respective input electrodes connected respectively to said second and first output nodes;

third and fourth transistors of a second conductivity type having respective first electrodes connected respectively to said first and second output nodes; and a drive circuit driven by said first signal and a complementary signal of said first signal, providing, in response to a leading edge of said complementary signal of said first signal, a third voltage higher than said first voltage between an input electrode and a second electrode of said third transistor to turn on said third transistor, and providing, in response to a leading edge of said first signal corresponding to a trailing edge of said complementary signal of said first signal, said third voltage between an input electrode and a second electrode of said fourth transistor to turn on said fourth transistor wherein said drive circuit includes a first capacitor having one electrode connected to the input electrode of said third transistor and the other electrode receiving the complementary signal of said first signal, a second capacitor having one electrode connected to the input electrode of said fourth transistor and the other electrode receiving said first signal, and a charge/discharge circuit for charging/discharging said first and second capacitors each to cause a voltage between one electrode and the other electrode of said first and second capacitors each to be equal to the threshold voltage of said third and fourth transistors.

2. An amplitude conversion circuit converting a first signal having an amplitude corresponding to a first voltage into a second signal having an amplitude corresponding to a second voltage higher than said first voltage, comprising:

first and second transistors of a first conductivity type having respective first electrodes both receiving said second voltage, respective second electrodes connected respectively to first and second output nodes for providing said second signal and a complementary signal of said second signal, and respective input electrodes both connected to said second output node;

third and fourth transistors of a second conductivity type having respective first electrodes connected respectively to said first and second output nodes; and a drive circuit driven by said first signal and a complementary signal of said first signal, providing, in response to a leading edge of said complementary signal of said first signal, a third voltage higher than said first voltage between an input electrode and a second electrode of said third transistor to turn on said third transistor, and providing, in response to a leading edge of said first signal corresponding to a trailing edge of said complementary signal of said first signal, said third voltage between an input electrode and a second electrode of said fourth transistor to turn on said fourth transistor.

3. The amplitude conversion circuit according to claim 1, wherein said charge/discharge circuit includes a voltage generation circuit generating a voltage approximately twice as high as the threshold voltage of said third and fourth transistors, first and second level shift circuits respectively provided correspondingly to said third and fourth transistors, said first and second level shift circuits each generating a voltage which is lower, by the threshold voltage of said third and fourth transistors, than an output voltage from said voltage generation circuit to provide the generated voltage to the input electrode of a corresponding one of said third and fourth transistors, and first and second diode elements connected in parallel with said first and second capacitors respectively.

4. The amplitude conversion circuit according to claim 3, wherein said first and second diode elements include fifth and sixth transistors of the second conductivity type connected in parallel with said first and second capacitors respectively and having respective input electrodes connected to respective input electrodes of said third and fourth transistors.

5. The amplitude conversion circuit according to claim 1, wherein said charge/discharge circuit includes a voltage generation circuit generating a voltage approximately twice as high as the threshold voltage of said third and fourth transistors, first and second level shift circuits respectively provided correspondingly to said third and fourth transistors, said first and second level shift circuits each generating a voltage which is lower, by the threshold voltage of said third and fourth transistors, than an output voltage from said voltage generation circuit to provide the generated voltage to the input electrode of a corresponding one of said third and fourth transistors, and first and second diode elements connected respectively between respective input electrodes of said third and fourth transistors and a node of a reference voltage.

6. The amplitude conversion circuit according to claim 5, wherein said first and second diode elements include fifth and sixth transistors of the second conductivity type connected respectively between respective input electrodes of said third and fourth transistors and the node of said reference voltage and having respective input electrodes connected to respective input electrodes of said third and fourth transistors.

7. The amplitude conversion circuit according to claim 3, wherein said voltage generation circuit includes a resistor element connected between a node of a fourth voltage and a third output node for providing the voltage approximately twice as high as the threshold voltage of said third and fourth transistors, and third and fourth diode elements connected in series between said third output node and a node of a reference voltage.

8. The amplitude conversion circuit according to claim 7, wherein said resistor element includes a seventh transistor connected between the node of said fourth voltage and said third output node and having an input electrode receiving a predetermined constant voltage.

9. The amplitude conversion circuit according to claim 7, wherein said third diode element includes an eighth transistor of the second conductivity type having an input electrode and a first electrode connected to said third output node, and said fourth diode element includes a ninth transistor of the second conductivity type having an input electrode and a first electrode connected to a second electrode of said eighth transistor and having a second electrode connected to the node of said reference voltage.

10. The amplitude conversion circuit according to claim 7, wherein said fourth voltage is equal to said second voltage.

11. The amplitude conversion circuit according to claim 3, wherein said first level shift circuit includes a tenth transistor of the second conductivity type connected between a node of a fifth voltage and the input electrode of said third transistor and having an input electrode receiving the output voltage from said voltage generation circuit, and said second level shift circuit includes an eleventh transistor of the second conductivity type connected between the node of said fifth voltage and the input electrode of said fourth transistor and having an input electrode receiving the output voltage from said voltage generation circuit.

12. The amplitude conversion circuit according to claim 11, wherein said fifth voltage is equal to said second voltage.

13. The amplitude conversion circuit according to claim 1, wherein respective second electrodes of said third and fourth transistors receive said first signal and the complementary signal of said first signal.

14. The amplitude conversion circuit according to claim 1, wherein respective second electrodes of said third and fourth transistors both receive a reference voltage.

15. The amplitude conversion circuit according to claim 1, further comprising fifth and sixth transistors of the second conductivity type connected respectively in parallel with said third and fourth transistors and having respective input electrodes connected to said second and first output nodes respectively.

16. The amplitude conversion circuit according to claim 1, further comprising fifth and sixth transistors of the second conductivity type connected respectively between said first and second output nodes and a node of a reference voltage and having respective input electrodes connected to said second and first output nodes respectively.

17. The amplitude conversion circuit according to claim 1, further comprising:
- a first switching element connected in series with said first transistor between a node of said second voltage and said first output node and turned off in response to the leading edge of said complementary signal of said first signal; and
- a second switching element connected in series with said second transistor between the node of said second voltage and said second output node and turned off in response to the leading edge of said first signal corresponding to the trailing edge of said complementary signal of said first signal.

18. The amplitude conversion circuit according to claim 17, wherein
- said first switching element includes a fifth transistor of the first conductivity type connected between the second electrode of said first transistor and said first output node and having its input electrode connected to the input electrode of said third transistor, and
- said second switching element includes a sixth transistor of the first conductivity type connected between the second electrode of said second transistor and said second output node and having its input electrode connected to the input electrode of said fourth transistor.

19. The amplitude conversion circuit according to claim 1, wherein said leading edge is a rising edge, and said trailing edge is a falling edge.

* * * * *